(12) United States Patent
Wang et al.

(10) Patent No.: US 8,836,412 B2
(45) Date of Patent: Sep. 16, 2014

(54) CHARGE PUMP WITH A POWER-CONTROLLED CLOCK BUFFER TO REDUCE POWER CONSUMPTION AND OUTPUT VOLTAGE RIPPLE

(71) Applicant: SanDisk 3D LLC, Milpitas, CA (US)

(72) Inventors: Kesheng Wang, Milpitas, CA (US); Ali Al-Shamma, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 14/101,164

(22) Filed: Dec. 9, 2013

(65) Prior Publication Data

US 2014/0225652 A1    Aug. 14, 2014

Related U.S. Application Data

(60) Provisional application No. 61/763,432, filed on Feb. 11, 2013.

(51) Int. Cl.
G05F 1/10    (2006.01)
G05F 3/02    (2006.01)
H03L 7/08    (2006.01)

(52) U.S. Cl.
CPC .................. *H03L 7/0802* (2013.01)
USPC ............ 327/537; 327/534; 327/535; 327/536

(58) Field of Classification Search
USPC ............... 327/148, 157, 534–537; 363/59, 60
See application file for complete search history.

(56) References Cited

U.S. PATENT DOCUMENTS

| | | |
|---|---|---|
| 3,697,860 A | 10/1972 | Baker |
| 4,511,811 A | 4/1985 | Gupta |
| 4,583,157 A | 4/1986 | Kirsch et al. |
| 4,636,748 A | 1/1987 | Latham |
| 4,736,121 A | 4/1988 | Cini et al. |
| 4,888,738 A | 12/1989 | Wong et al. |
| 5,140,182 A | 8/1992 | Ichimura |
| 5,168,174 A | 12/1992 | Naso et al. |
| 5,175,706 A | 12/1992 | Edme |
| 5,263,000 A | 11/1993 | Van Buskirk et al. |
| 5,392,205 A | 2/1995 | Zavaleta |
| 5,436,587 A | 7/1995 | Cernea |
| 5,483,434 A | 1/1996 | Seesink |
| 5,508,971 A | 4/1996 | Cernea et al. |
| 5,521,547 A | 5/1996 | Tsukada |
| 5,563,779 A | 10/1996 | Cave et al. |
| 5,563,825 A | 10/1996 | Cernea et al. |
| 5,568,424 A | 10/1996 | Cernea et al. |

(Continued)

FOREIGN PATENT DOCUMENTS

| | | |
|---|---|---|
| DE | 10 2007 02629 | 7/2008 |
| EP | 0 382 929 A | 8/1990 |

(Continued)

OTHER PUBLICATIONS

Feng Pan et al., "Charge Pump Circuit Design", McGraw-Hill, 2006, 26 pages.

(Continued)

*Primary Examiner* — Brandon S Cole
(74) *Attorney, Agent, or Firm* — Davis Wright Tremaine LLP

(57) ABSTRACT

A charge pump system includes a charge pump that receives its clock signals, generated by an oscillator circuit, though a clock buffer. The clock buffer is power-controlled to reduce power consumption and output voltage ripple. The buffer is formed of a series of inverter that are connected to the power supply level through a clamping element, such as a transistor whose gate is controlled by a regulation signal based on feedback from the pump's output.

15 Claims, 29 Drawing Sheets

(56) References Cited

U.S. PATENT DOCUMENTS

| | | | |
|---|---|---|---|
| 5,570,315 A | 10/1996 | Tanaka et al. | |
| 5,592,420 A | 1/1997 | Cernea et al. | |
| 5,596,532 A | 1/1997 | Cernea et al. | |
| 5,602,794 A | 2/1997 | Javanifard et al. | |
| 5,621,685 A | 4/1997 | Cernea et al. | |
| 5,625,544 A | 4/1997 | Kowshik et al. | |
| 5,693,570 A | 12/1997 | Cernea et al. | |
| 5,732,039 A | 3/1998 | Javanifard et al. | |
| 5,734,286 A | 3/1998 | Takeyama et al. | |
| 5,767,735 A | 6/1998 | Javanifard et al. | |
| 5,781,473 A | 7/1998 | Javanifard et al. | |
| 5,801,987 A | 9/1998 | Dinh | |
| 5,818,766 A | 10/1998 | Song | |
| 5,828,596 A | 10/1998 | Takata et al. | |
| 5,903,495 A | 5/1999 | Takeuchi et al. | |
| 5,943,226 A | 8/1999 | Kim | |
| 5,945,870 A | 8/1999 | Chu et al. | |
| 5,969,565 A | 10/1999 | Naganawa | |
| 5,973,546 A | 10/1999 | Le et al. | |
| 5,982,222 A | 11/1999 | Kyung | |
| 6,008,690 A | 12/1999 | Takeshima et al. | |
| 6,018,264 A * | 1/2000 | Jin | 327/536 |
| 6,023,187 A | 2/2000 | Camacho et al. | |
| 6,026,002 A | 2/2000 | Viehmann | |
| 6,046,935 A | 4/2000 | Takeuchi et al. | |
| 6,104,225 A | 8/2000 | Taguchi et al. | |
| 6,107,862 A | 8/2000 | Mukainakano et al. | |
| 6,134,145 A | 10/2000 | Wong | |
| 6,151,229 A | 11/2000 | Taub et al. | |
| 6,154,088 A | 11/2000 | Chevallier et al. | |
| 6,157,242 A | 12/2000 | Fukui | |
| 6,188,590 B1 | 2/2001 | Chang et al. | |
| 6,198,645 B1 | 3/2001 | Kotowski et al. | |
| 6,208,198 B1 | 3/2001 | Lee | |
| 6,249,445 B1 | 6/2001 | Sugasawa | |
| 6,249,898 B1 | 6/2001 | Koh et al. | |
| 6,275,096 B1 | 8/2001 | Hsu et al. | |
| 6,285,622 B1 | 9/2001 | Haraguchi et al. | |
| 6,297,687 B1 | 10/2001 | Sugimura | |
| 6,307,425 B1 | 10/2001 | Chevallier et al. | |
| 6,314,025 B1 | 11/2001 | Wong | |
| 6,320,428 B1 | 11/2001 | Atsumi et al. | |
| 6,320,796 B1 | 11/2001 | Voo et al. | |
| 6,329,869 B1 | 12/2001 | Matano | |
| 6,344,959 B1 | 2/2002 | Milazzo | |
| 6,344,984 B1 | 2/2002 | Miyazaki | |
| 6,359,798 B1 | 3/2002 | Han et al. | |
| 6,369,642 B1 | 4/2002 | Zeng et al. | |
| 6,370,075 B1 | 4/2002 | Haeberli et al. | |
| 6,385,107 B1 | 5/2002 | Bedarida et al. | |
| 6,400,202 B1 | 6/2002 | Fifield et al. | |
| 6,404,274 B1 | 6/2002 | Hosono et al. | |
| 6,411,157 B1 * | 6/2002 | Hsu et al. | 327/536 |
| 6,424,570 B1 | 7/2002 | Le et al. | |
| 6,445,243 B2 | 9/2002 | Myono | |
| 6,456,170 B1 | 9/2002 | Segawa et al. | |
| 6,476,666 B1 | 11/2002 | Palusa et al. | |
| 6,486,728 B2 | 11/2002 | Kleveland | |
| 6,518,830 B2 | 2/2003 | Gariboldi et al. | |
| 6,525,614 B2 | 2/2003 | Tanimoto | |
| 6,525,949 B1 | 2/2003 | Johnson et al. | |
| 6,531,792 B2 | 3/2003 | Oshio | |
| 6,538,930 B2 | 3/2003 | Ishii et al. | |
| 6,545,529 B2 | 4/2003 | Kim | |
| 6,556,465 B2 | 4/2003 | Wong et al. | |
| 6,577,535 B2 | 6/2003 | Pasternak | |
| 6,606,267 B2 | 8/2003 | Wong | |
| 6,661,682 B2 | 12/2003 | Kim et al. | |
| 6,703,891 B2 | 3/2004 | Tanaka | |
| 6,724,241 B1 | 4/2004 | Bedarida et al. | |
| 6,734,718 B1 | 5/2004 | Pan | |
| 6,760,262 B2 | 7/2004 | Haeberli et al. | |
| 6,781,440 B2 | 8/2004 | Huang | |
| 6,798,274 B2 | 9/2004 | Tanimoto | |
| 6,819,162 B2 | 11/2004 | Pelliconi | |
| 6,834,001 B2 | 12/2004 | Myono | |
| 6,859,091 B1 | 2/2005 | Nicholson et al. | |
| 6,878,981 B2 | 4/2005 | Eshel | |
| 6,891,764 B2 | 5/2005 | Li | |
| 6,894,554 B2 | 5/2005 | Ito | |
| 6,922,096 B2 | 7/2005 | Cernea | |
| 6,927,441 B2 | 8/2005 | Pappalardo et al. | |
| 6,933,768 B2 | 8/2005 | Hausmann | |
| 6,944,058 B2 | 9/2005 | Wong | |
| 6,975,135 B1 | 12/2005 | Bui | |
| 6,985,397 B2 | 1/2006 | Tokui et al. | |
| 6,990,031 B2 | 1/2006 | Hashimoto et al. | |
| 6,995,603 B2 | 2/2006 | Chen et al. | |
| 7,002,381 B1 | 2/2006 | Chung | |
| 7,023,260 B2 | 4/2006 | Thorp et al. | |
| 7,030,683 B2 | 4/2006 | Pan et al. | |
| 7,092,263 B2 | 8/2006 | Chang | |
| 7,113,023 B2 | 9/2006 | Cernea | |
| 7,116,154 B2 | 10/2006 | Guo | |
| 7,116,155 B2 | 10/2006 | Pan | |
| 7,120,051 B2 | 10/2006 | Gorobets et al. | |
| 7,129,759 B2 | 10/2006 | Fukami | |
| 7,135,910 B2 | 11/2006 | Cernea | |
| 7,135,911 B2 | 11/2006 | Imamiya | |
| 7,205,682 B2 | 4/2007 | Kuramori | |
| 7,208,996 B2 | 4/2007 | Suzuki et al. | |
| 7,215,179 B2 | 5/2007 | Yamazoe et al. | |
| 7,224,591 B2 | 5/2007 | Kaishita et al. | |
| 7,227,780 B2 | 6/2007 | Komori et al. | |
| 7,239,192 B2 | 7/2007 | Tailliet | |
| 7,253,675 B2 | 8/2007 | Aksin et al. | |
| 7,253,676 B2 | 8/2007 | Fukuda et al. | |
| 7,259,612 B2 | 8/2007 | Saether | |
| 7,276,960 B2 | 10/2007 | Peschke | |
| 7,279,957 B2 | 10/2007 | Yen | |
| 7,345,928 B2 | 3/2008 | Li | |
| 7,368,979 B2 | 5/2008 | Govindu et al. | |
| 7,397,677 B1 | 7/2008 | Collins et al. | |
| 7,468,628 B2 | 12/2008 | Im et al. | |
| 7,495,500 B2 | 2/2009 | Al-Shamma et al. | |
| 7,521,978 B2 | 4/2009 | Kim et al. | |
| 7,554,311 B2 | 6/2009 | Pan | |
| 7,579,902 B2 | 8/2009 | Frulio et al. | |
| 7,579,903 B2 | 8/2009 | Oku | |
| 7,602,233 B2 | 10/2009 | Pietri et al. | |
| 7,671,572 B2 | 3/2010 | Chung | |
| 7,696,812 B2 | 4/2010 | Al-Shamma et al. | |
| 7,772,914 B2 | 8/2010 | Jung | |
| 7,795,952 B2 | 9/2010 | Lui et al. | |
| 7,830,203 B2 * | 11/2010 | Chang et al. | 327/544 |
| 8,093,953 B2 | 1/2012 | Pierdomineco et al. | |
| 8,159,091 B2 | 4/2012 | Yeates | |
| 8,193,853 B2 | 6/2012 | Hsieh et al. | |
| 8,242,834 B2 | 8/2012 | Chuang et al. | |
| 8,339,183 B2 | 12/2012 | Htoo et al. | |
| 8,395,440 B2 * | 3/2013 | Sandhu et al. | 327/540 |
| 8,604,868 B2 | 12/2013 | Ucciardello et al. | |
| 2002/0008566 A1 | 1/2002 | Taito et al. | |
| 2002/0014908 A1 | 2/2002 | Lauterbach | |
| 2002/0075706 A1 | 6/2002 | Foss et al. | |
| 2002/0130701 A1 | 9/2002 | Kleveland | |
| 2002/0130704 A1 | 9/2002 | Myono et al. | |
| 2002/0140463 A1 | 10/2002 | Cheung | |
| 2003/0128560 A1 | 7/2003 | Saiki et al. | |
| 2003/0214346 A1 | 11/2003 | Pelliconi | |
| 2004/0046603 A1 | 3/2004 | Bedarida et al. | |
| 2005/0024125 A1 | 2/2005 | McNitt et al. | |
| 2005/0030088 A1 | 2/2005 | Cernea | |
| 2005/0093614 A1 | 5/2005 | Lee | |
| 2005/0195017 A1 | 9/2005 | Chen et al. | |
| 2005/0237103 A1 | 10/2005 | Cernea | |
| 2005/0248386 A1 | 11/2005 | Pan et al. | |
| 2006/0114053 A1 | 6/2006 | Sohara et al. | |
| 2006/0244518 A1 | 11/2006 | Byeon et al. | |
| 2006/0250177 A1 | 11/2006 | Thorp et al. | |
| 2007/0001745 A1 | 1/2007 | Yen | |
| 2007/0053216 A1 | 3/2007 | Alenin | |
| 2007/0069805 A1 | 3/2007 | Choi et al. | |
| 2007/0126494 A1 | 6/2007 | Pan | |

(56) References Cited

U.S. PATENT DOCUMENTS

| | | |
|---|---|---|
| 2007/0139099 A1 | 6/2007 | Pan |
| 2007/0139100 A1 | 6/2007 | Pan |
| 2007/0210853 A1 | 9/2007 | Maejima |
| 2007/0211502 A1 | 9/2007 | Komiya |
| 2007/0222498 A1 | 9/2007 | Choy et al. |
| 2007/0229149 A1 | 10/2007 | Pan et al. |
| 2008/0024096 A1 | 1/2008 | Pan |
| 2008/0024198 A1 | 1/2008 | Bitonti et al. |
| 2008/0042731 A1 | 2/2008 | Daga et al. |
| 2008/0111604 A1 | 5/2008 | Boerstler et al. |
| 2008/0116963 A1 | 5/2008 | Jung |
| 2008/0136500 A1 | 6/2008 | Frulio et al. |
| 2008/0157852 A1 | 7/2008 | Pan |
| 2008/0157859 A1 | 7/2008 | Pan |
| 2008/0218134 A1 | 9/2008 | Kawakami |
| 2008/0239802 A1 | 10/2008 | Thorpe |
| 2008/0239856 A1 | 10/2008 | Thorpe |
| 2008/0278222 A1 | 11/2008 | Conti et al. |
| 2008/0307342 A1 | 12/2008 | Furches et al. |
| 2009/0033306 A1 | 2/2009 | Tanzawa |
| 2009/0051413 A1 | 2/2009 | Chu et al. |
| 2009/0058506 A1 | 3/2009 | Nandi et al. |
| 2009/0058507 A1 | 3/2009 | Nandi et al. |
| 2009/0091366 A1* | 4/2009 | Baek et al. ............... 327/332 |
| 2009/0121780 A1 | 5/2009 | Chen et al. |
| 2009/0153230 A1 | 6/2009 | Pan et al. |
| 2009/0153231 A1 | 6/2009 | Pan et al. |
| 2009/0153232 A1 | 6/2009 | Fort et al. |
| 2009/0167418 A1 | 7/2009 | Raghavan |
| 2009/0174441 A1 | 7/2009 | Gebara et al. |
| 2009/0184697 A1 | 7/2009 | Park |
| 2009/0219077 A1 | 9/2009 | Pietri et al. |
| 2009/0315598 A1* | 12/2009 | Namekawa ............... 327/157 |
| 2009/0315616 A1 | 12/2009 | Nguyen et al. |
| 2009/0322413 A1 | 12/2009 | Huynh et al. |
| 2010/0019832 A1 | 1/2010 | Pan |
| 2010/0033232 A1 | 2/2010 | Pan |
| 2010/0074034 A1 | 3/2010 | Cazzaniga |
| 2010/0085794 A1 | 4/2010 | Chen et al. |
| 2010/0244935 A1 | 9/2010 | Kim et al. |
| 2010/0302877 A1 | 12/2010 | Bang |
| 2011/0026329 A1 | 2/2011 | Wada |
| 2011/0133821 A1 | 6/2011 | Honda |
| 2011/0156803 A1 | 6/2011 | Yap et al. |
| 2011/0176370 A1 | 7/2011 | Izumi et al. |
| 2011/0254615 A1 | 10/2011 | Raghunathan et al. |
| 2013/0162229 A1 | 6/2013 | Chan |

FOREIGN PATENT DOCUMENTS

| | | |
|---|---|---|
| EP | 0 780 515 A | 6/1997 |
| JP | 2007-020268 | 1/2007 |
| WO | 01/06336 A1 | 1/2001 |
| WO | WO 2006/132757 | 12/2006 |

OTHER PUBLICATIONS

Louie Pylarinos et al., "Charge Pumps: An Overview", Department of Electrical and Computer Engineering University of Toronto, 7 pages.

Ang et al., "An On-Chip Voltage Regulator Using Switched Decoupling Capacitors," 2000 IEEE International Solid-State Circuits Conference, 2 pages.

U.S. Appl. No. 12/506,998 entitled "Charge Pump with Current Based Regulation" filed Jul. 21, 2009, 21 pages.

U.S. Appl. No. 12/634,385 entitled "Multi-Stage Charge Pump with Variable Number of Boosting Stages" filed Dec. 9, 2009, 33 pages.

* cited by examiner ically include two-dimensional arrays of non-volatile memory cells. The memory cells within a two-dimensional array form a single layer of memory cells and may be selected via control lines in the X and Y directions. Non-volatile memory devices may also include monolithic three-dimensional memory arrays in which multiple layers of memory cells are formed above a single substrate without any intervening substrates.

CHARGE PUMP WITH A POWER-CONTROLLED CLOCK BUFFER TO REDUCE POWER CONSUMPTION AND OUTPUT VOLTAGE RIPPLE

CROSS-REFERENCE TO RELATE APPLICATION

This application claims priority from U.S. Provisional Application No. 61/763,432, filed on Feb. 11, 2013, which is hereby incorporated in its entirety by this reference.

FIELD OF THE INVENTION

This invention pertains generally to the field of charge pumps and more particularly to techniques for regulating charge pumps.

BACKGROUND

Semiconductor memory is widely used in various electronic devices such as cellular telephones, digital cameras, personal digital assistants, mobile computing devices, and non-mobile computing devices. A non-volatile memory device (e.g., a flash memory device) allows information to be stored and retained even when the non-volatile memory device is not connected to a source of power (e.g., a battery). Non-volatile memory devices typically include two-dimensional arrays of non-volatile memory cells. The memory cells within a two-dimensional array form a single layer of memory cells and may be selected via control lines in the X and Y directions. Non-volatile memory devices may also include monolithic three-dimensional memory arrays in which multiple layers of memory cells are formed above a single substrate without any intervening substrates.

Charge pumps use a switching process to provide a DC output voltage larger or lower than its DC input voltage. Charge pumps are used in many contexts. For example, they are used as peripheral circuits on non-volatile memories to generate many of the needed operating voltages, such as programming or erase voltages, from a lower power supply voltage. A number of charge pump designs, such as conventional Dickson-type pumps, are known in the art. But given the common reliance upon charge pumps, there is an ongoing need for improvements in pump design, particularly with respect to trying to save on current consumption.

SUMMARY

In a principle set of aspects, a charge pump system includes a charge pump circuit, regulation circuitry, an oscillator circuit and a number of clock buffer circuits. The charge pump circuit is connected to receive N pump clock signals and generate from these an output voltage, where N is an integer greater than or equal to one. The regulation circuitry is connected to receive the output voltage and generate a regulation signal based on the output voltage. The oscillator circuit provides N initial clock signals. N clock buffer circuits each receive a corresponding one of the initial clock signals and generate from it a corresponding one of the pump clock signals. Each of the buffer circuits includes: a plurality of inverters connected in series, with the first inverter in the series connected to receive the corresponding initial clock signal as input and the last inverter in the series providing the corresponding pump clock signal as output; and a corresponding plurality of clamp elements connected to receive the regulation signal and through which a corresponding one of the inverter is connected to a power supply level, the voltage level being supplied to the corresponding inverter being dependent upon the regulation signal.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

In some cases, a semiconductor memory array may include a cross-point memory array. A cross-point memory array comprises a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a phase change material. Each memory cell in a cross-point memory array may be placed in series with a steering element, such as a diode, in order to reduce leakage currents associated with unselected memory cells.

Figure 1A:
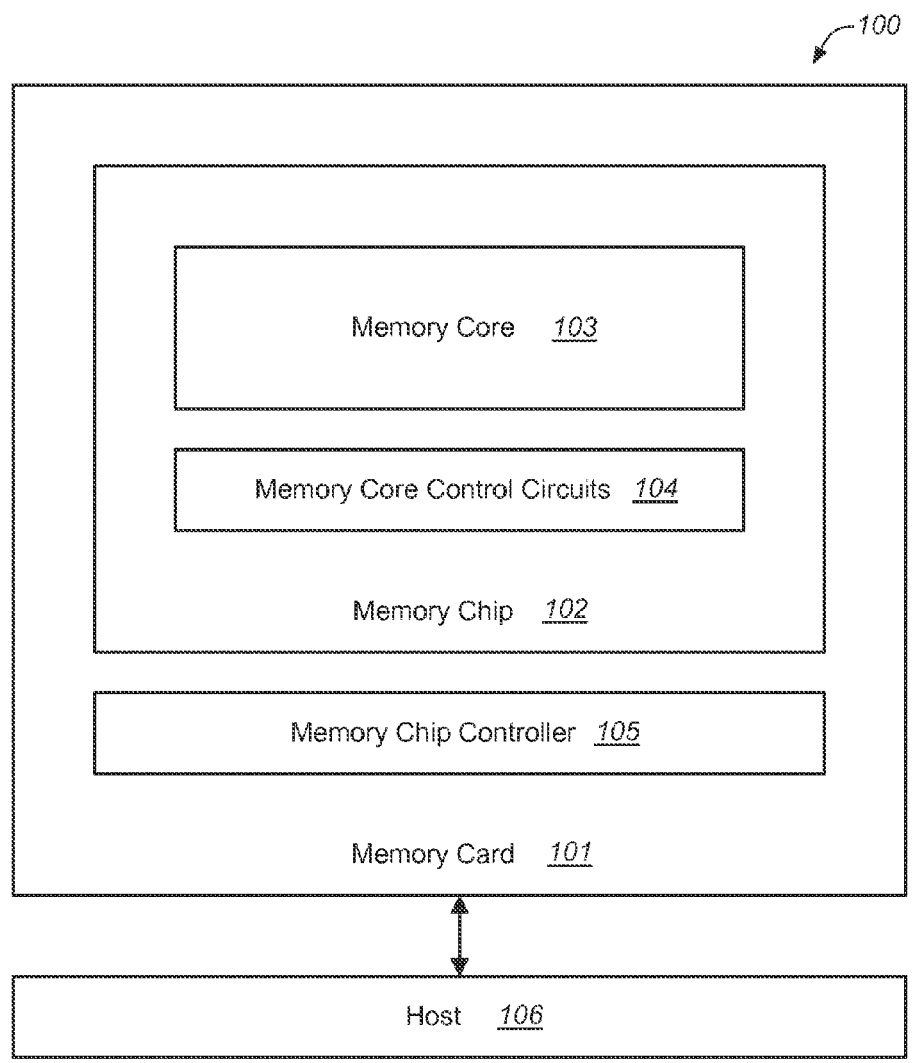
FIG. 1A depicts one embodiment of a memory system.

FIG. 1A depicts one embodiment of a memory system 100. Memory system 100 includes a host 106 (e.g., a personal computer or mobile computing device) and a memory card 101. The memory card 101 includes a memory chip controller 105 and a memory chip 102. The memory chip controller 105 may include one or more state machines, page registers, SRAM, or other control logic for controlling the operation of memory chip 102. The one or more state machines, page registers, SRAM, and/or other control logic for controlling the operation of the memory chip may be referred to as managing or control circuits for facilitating one or more memory array operations including erasing, programming, or reading operations. The memory chip controller may receive data and commands from host 106 and provides memory chip data to host 106.

In one embodiment, the memory chip controller 105 and memory chip 102 may be arranged on a single integrated circuit. In other embodiments, memory chip controller 105 and memory chip 102 may be arranged on different integrated circuits. The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, or generating row and column addresses. The memory core 103 may include one or more two-dimensional arrays of memory cells or one or more three-dimensional arrays of memory cells. In one embodiment, the memory core control circuits 104 and memory core 103 are arranged on a single integrated circuit. In other embodiments, the memory core control circuits 104 and memory core 103 are arranged on different integrated circuits.

Referring to FIG. 1A, a memory card operation may be initiated when host 106 sends instructions to memory chip controller 105 indicating that it would like to read data from memory card 101 or write data to memory card 101. In the event of a write (or programming) operation, host 106 will send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

As depicted in FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

Figure 1B:
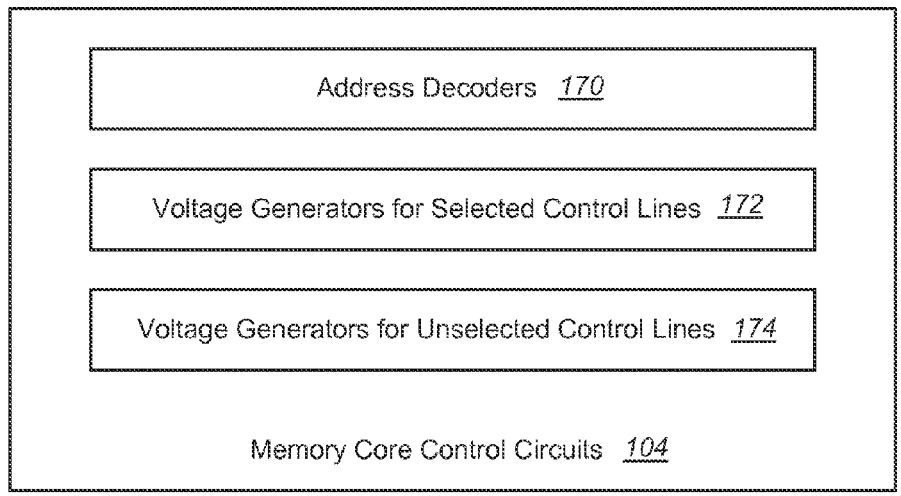
FIG. 1B depicts one embodiment of memory core control circuits.

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
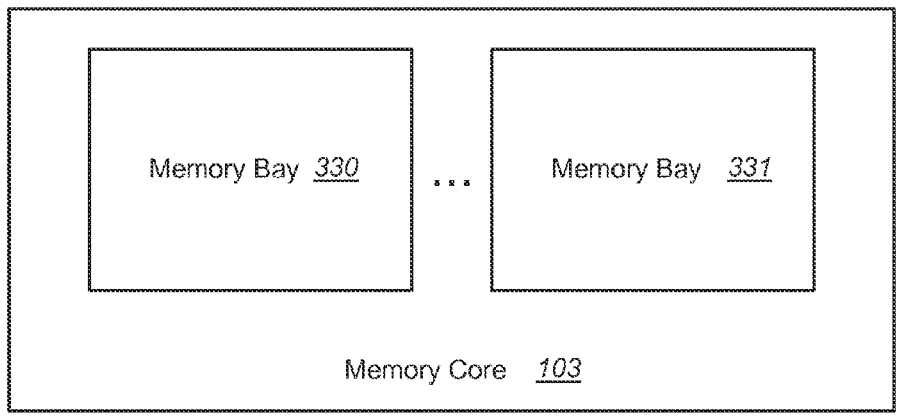
FIG. 1C depicts one embodiment of a memory core.

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays).

Figure 1D:
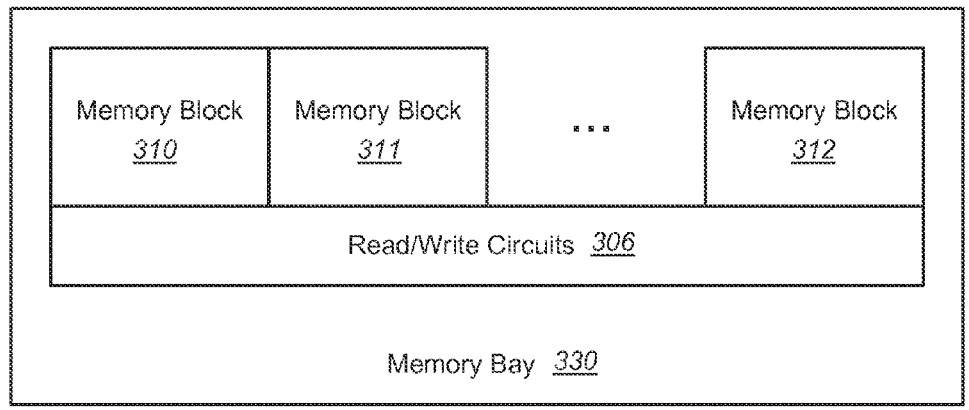
FIG. 1D depicts one embodiment of a memory bay.

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block should be electrically coupled to read/write circuits 306 at a particular time to avoid signal conflicts.

Figure 1E:
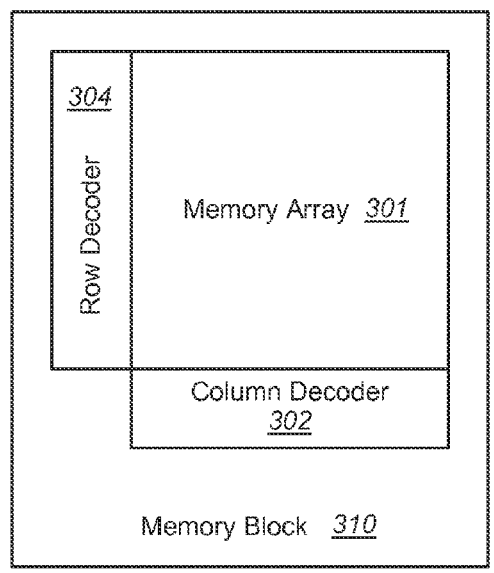
FIG. 1E depicts one embodiment of a memory block.

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells (i.e., memory array 310 may comprise a two-dimensional memory array or a three-dimensional memory array). The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
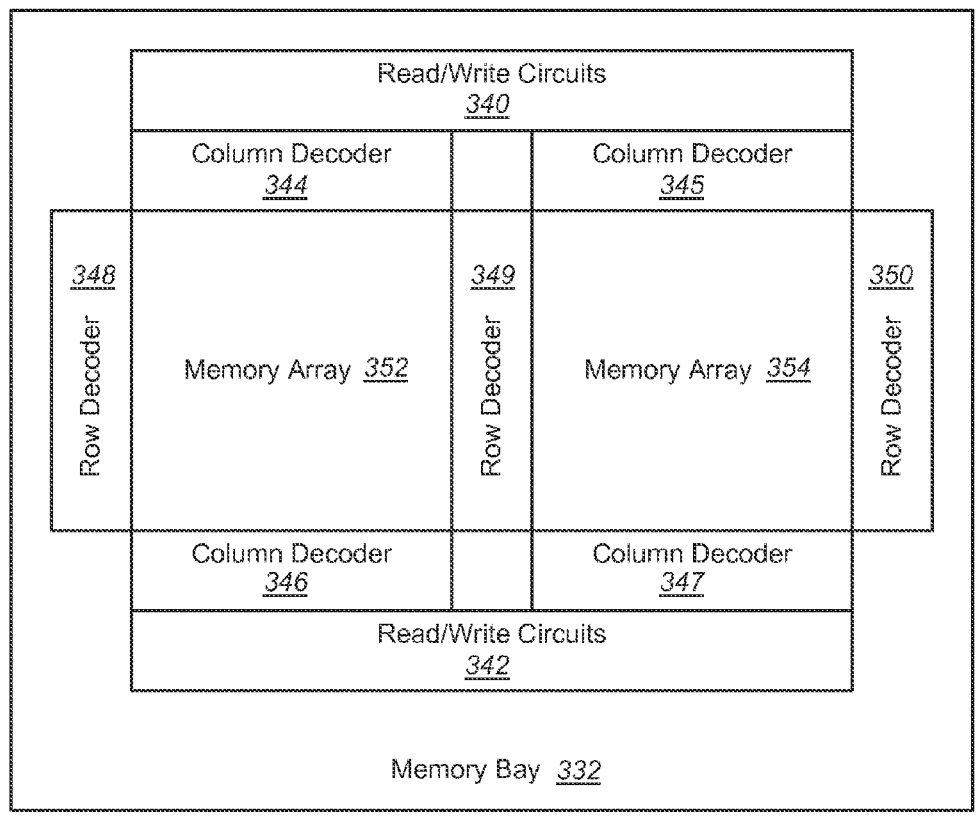
FIG. 1F depicts another embodiment of a memory bay.

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split allows for a more efficient layout of the memory bay.

Figure 2A:
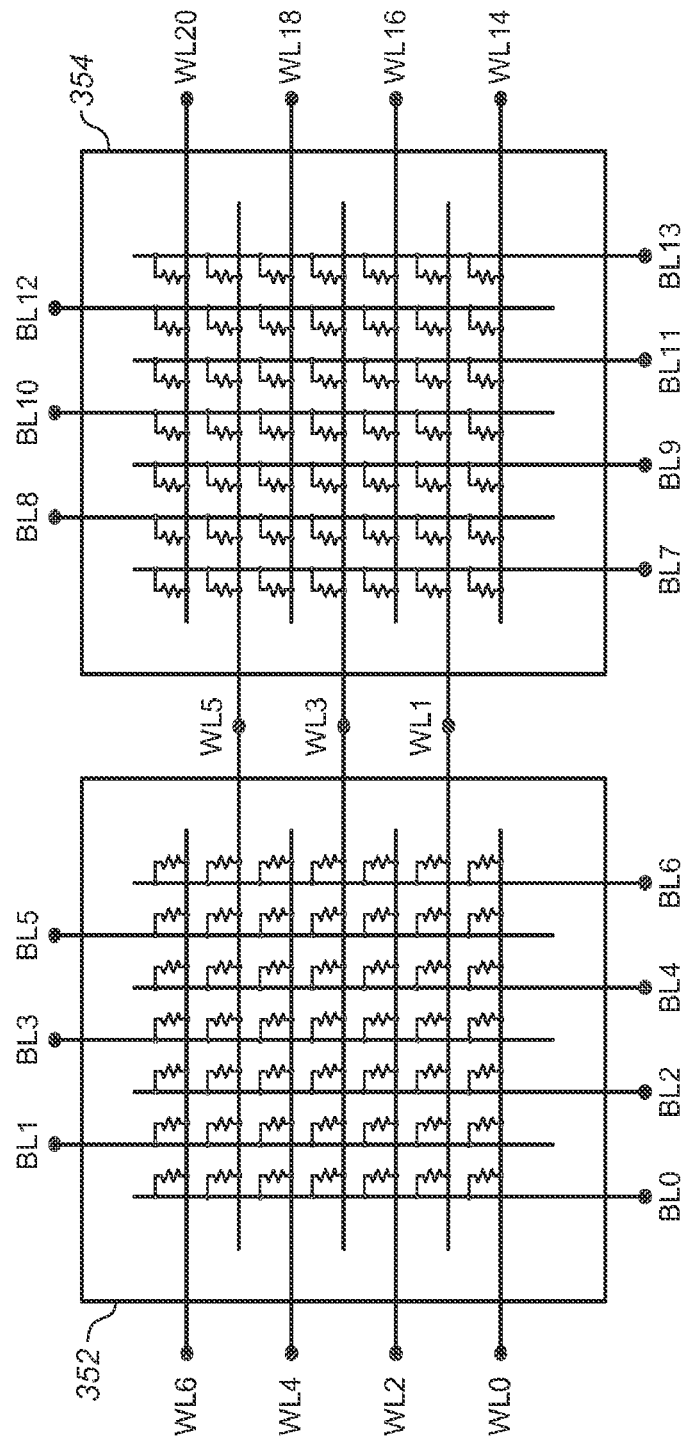
FIG. 2A depicts one embodiment of a schematic diagram corresponding with the memory bay of FIG. 1F.

FIG. 2A depicts one embodiment of a schematic diagram (including word lines and bit lines) corresponding with memory bay 332 in FIG. 1F. As depicted, word lines WL1, WL3, and WL5 are shared between memory arrays 352 and 354 and controlled by row decoder 349 of FIG. 1F. Word lines WL0, WL2, WL4, and WL6 are driven from the left side of memory array 352 and controlled by row decoder 348 of FIG. 1F. Word lines WL14, WL16, WL18, and WL20 are driven from the right side of memory array 354 and controlled by row decoder 350 of FIG. 1F. Bit lines BL0, BL2, BL4, and BL6 are driven from the bottom of memory array 352 and controlled by column decoder 346 of FIG. 1F. Bit lines BL1, BL3, and BL5 are driven from the top of memory array 352 and controlled by column decoder 344 of FIG. 1F.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical to the supporting substrate (i.e., the vertical plane is perpendicular to the supporting substrate).

Figure 2B:
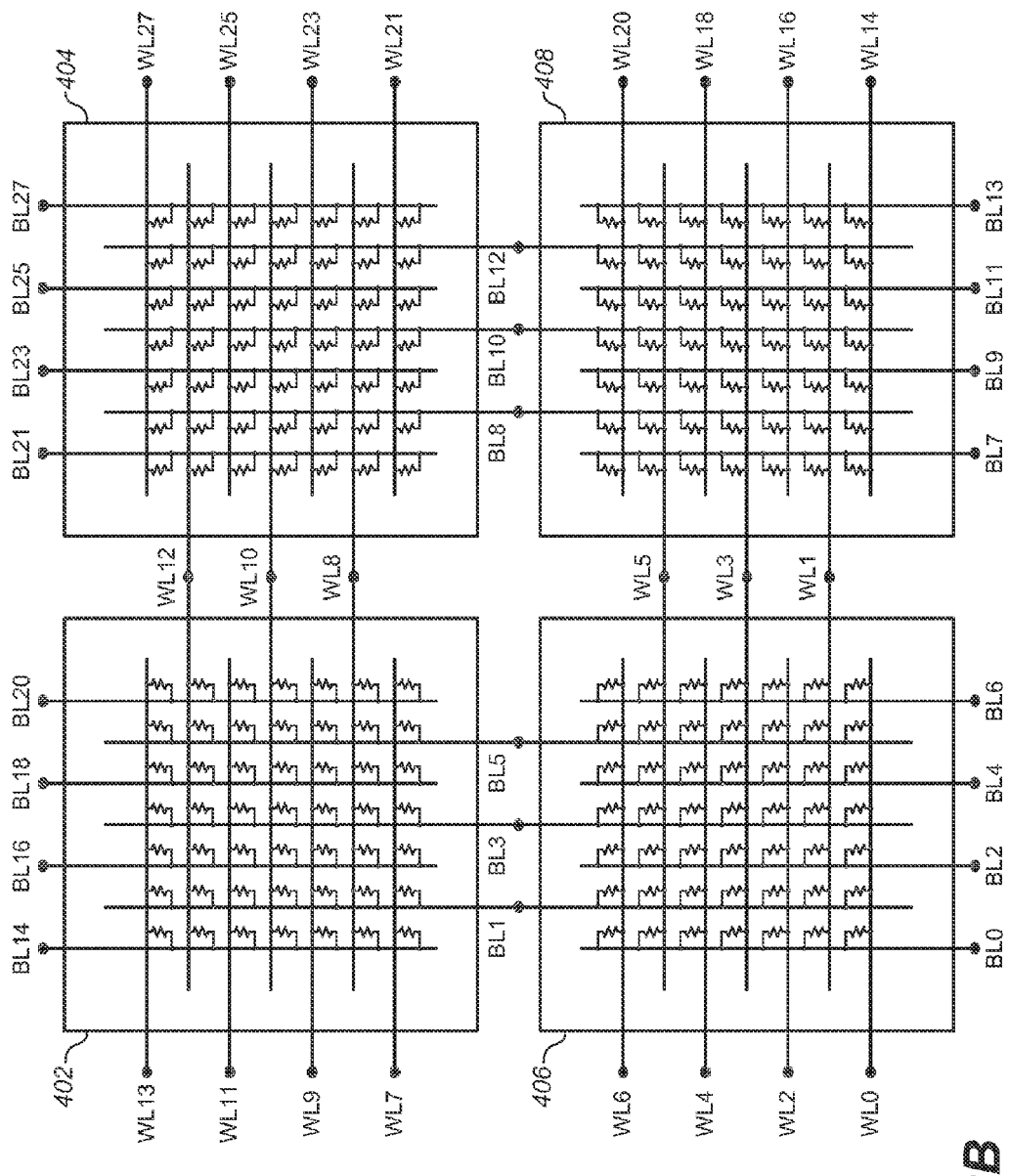
FIG. 2B depicts one embodiment of a schematic diagram corresponding with a memory bay arrangement wherein word lines and bit lines are shared across memory blocks, and both row decoders and column decoders are split.

FIG. 2B depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area since a single row decoder and/or column decoder can be used to support two memory arrays. As depicted, word lines WL1, WL3, and WL5 are shared between memory arrays 406 and 408. Bit lines BL1, BL3, and BL5 are shared between memory arrays 406 and 402. Row decoders are split such that word lines WL0, WL2, WL4, and WL6 are driven from the left side of memory array 406 and word lines WL1, WL3, and WL5 are driven from the right side of memory array 406. Column decoders are split such that bit lines BL0, BL2, BL4, and BL6 are driven from the bottom of memory array 406 and bit lines BL1, BL3, and BL5 are driven from the top of memory array 406. Splitting row and/or column decoders also helps to relieve layout constraints (e.g., the column decoder pitch can be relieved by 2× since the split column decoders need only drive every other bit line instead of every bit line).

Figure 3A:
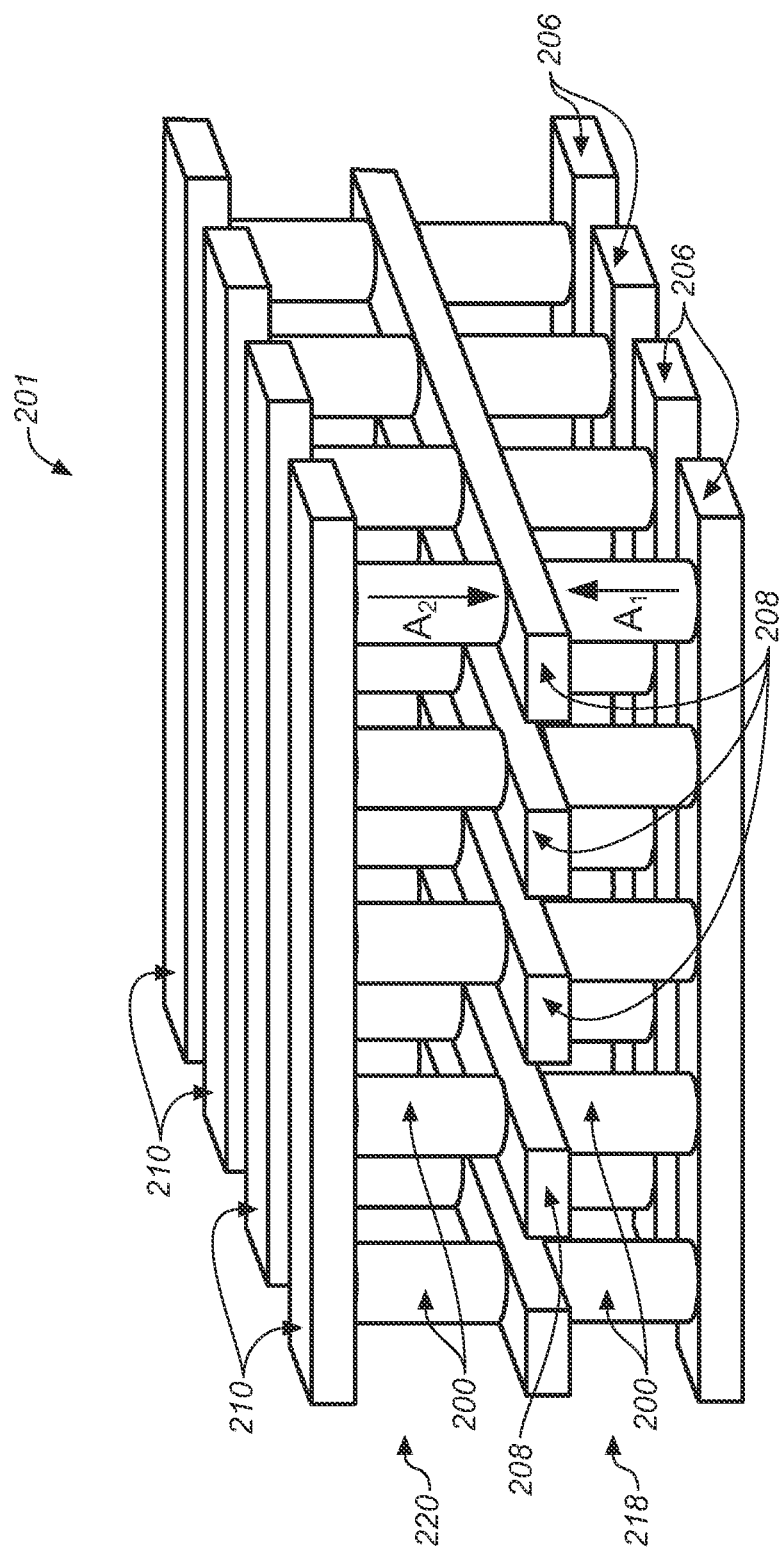
FIG. 3A depicts one embodiment of a portion of a monolithic three-dimensional memory array.

FIG. 3A depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 3A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes only a state change element. The absence of a diode from a memory cell may reduce the process complexity and costs associated with manufacturing a memory array.

In one embodiment, the memory cells 200 of FIG. 3A include re-writable non-volatile memory cells. In one example, U.S. Patent Application Publication No. 2006/0250836, which is herein incorporated by reference in its entirety, describes a rewriteable non-volatile memory cell that includes a diode coupled in series with a reversible resistance-switching element. A reversible resistance-switching element includes reversible resistivity-switching material having a resistivity that may be reversibly switched between two or more states. In one embodiment, the reversible resistance-switching material may include a metal oxide. The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 3A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 3A, in one embodiment of a read operation, the data stored in one of the plurality of memory cells 200 may be read by biasing one of the word lines (i.e., the selected word line) to the selected word line voltage in read mode (e.g., 0.4V). A read circuit is then used to bias a selected bit line connected to the selected memory cell to the selected bit line voltage in read mode (e.g., 0V). In some cases, in order to avoid sensing leakage current from the many unselected word lines to the selected bit line, the unselected word lines may be biased to the same voltage as the selected bit lines (e.g., 0V). To avoid leakage current from the selected word line to the unselected bit lines, the unselected bit lines may be biased to the same voltage as the selected word line (e.g., 0.4V); however, biasing the unselected word lines to the same voltage as the selected bit lines and biasing the unselected bit lines to the same voltage as the selected word line will place a large voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. Leakage current may be subtracted out by using the auto zero current sensing.

Referring to FIG. 3A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation is similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "0" and the low-resistivity state may be associated with binary data "1." In other embodiments, SETTING and RESETTING operations and/or the data encoding can be reversed. In some embodiments, the first time a resistance-switching element is SET requires a higher than normal voltage and is referred to as a FORMING operation.

Referring to FIG. 3A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 3B:
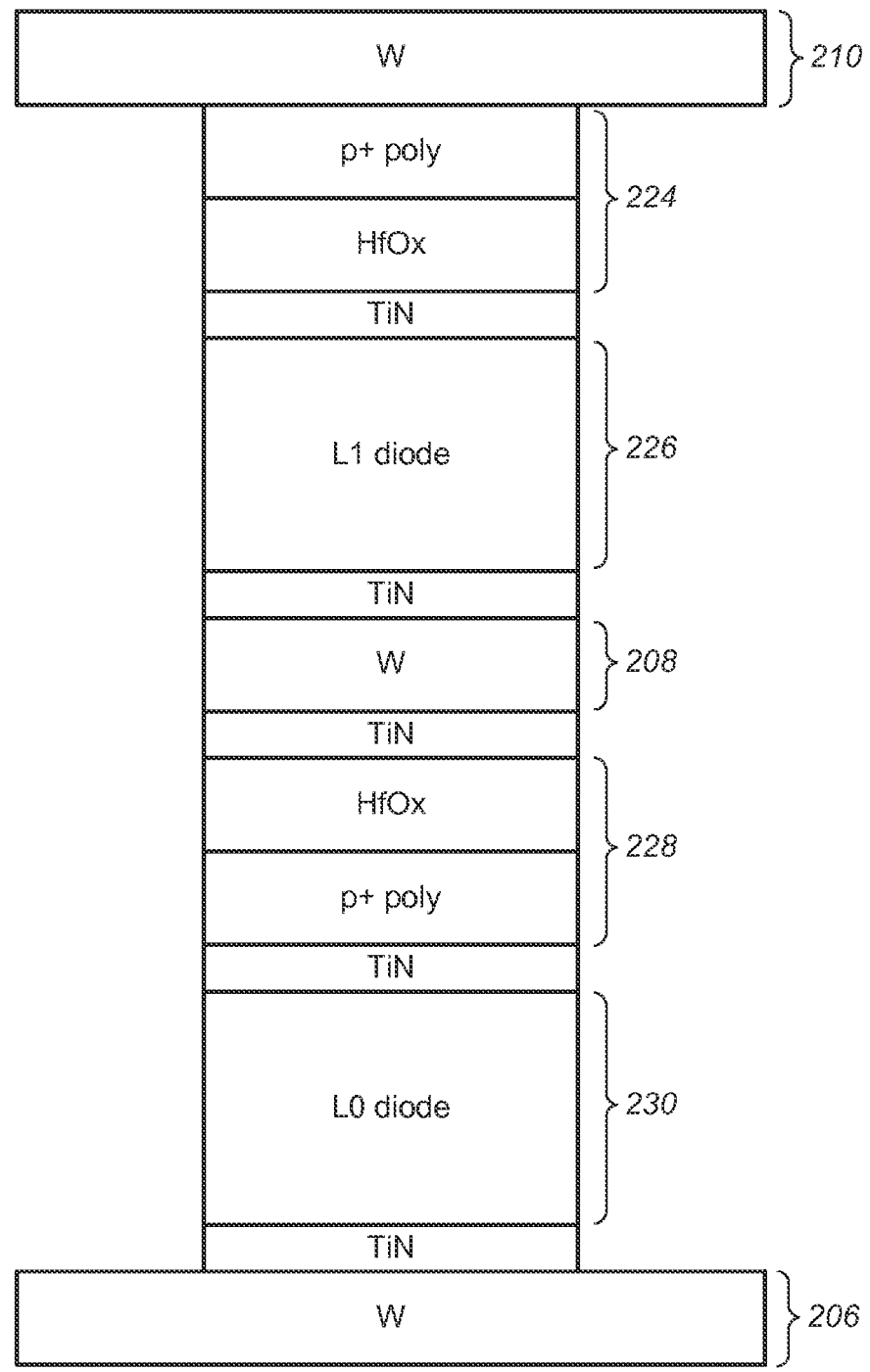
FIG. 3B depicts one embodiment of a portion of a monolithic three-dimensional memory array that includes a second memory level positioned above a first memory level.

FIG. 3B depicts one embodiment of a portion of a monolithic three-dimensional memory array that includes a second memory level positioned above a first memory level. The second memory level includes memory element 224 and steering element 226. The first memory level includes memory element 228 and steering element 230. The bit lines 206 and 210 are arranged in a first direction and the word line 208 is arranged in a second direction perpendicular to the first direction. As depicted, the memory element 224 may include a memory layer stack comprising a layer of p-type polycrystalline silicon (or polysilicon) formed above a layer of hafnium oxide. The steering element 226 may comprise a diode (e.g., a L1 diode) pointing in a first direction. The memory element 228 may include a memory layer stack comprising a layer of hafnium oxide formed above a layer of p-type polysilicon. The steering element 230 may comprise a diode (e.g., a L0 diode) pointing in a second direction different from the first direction. The bit lines 206 and 210 and the word line 208 may comprise a tungsten layer. In some cases, titanium nitride layers may be used as barrier layers (e.g., formed between a memory element and a steering element) or adhesion layers (e.g., formed above a word line layer or a bit line layer).

Figure 3C:
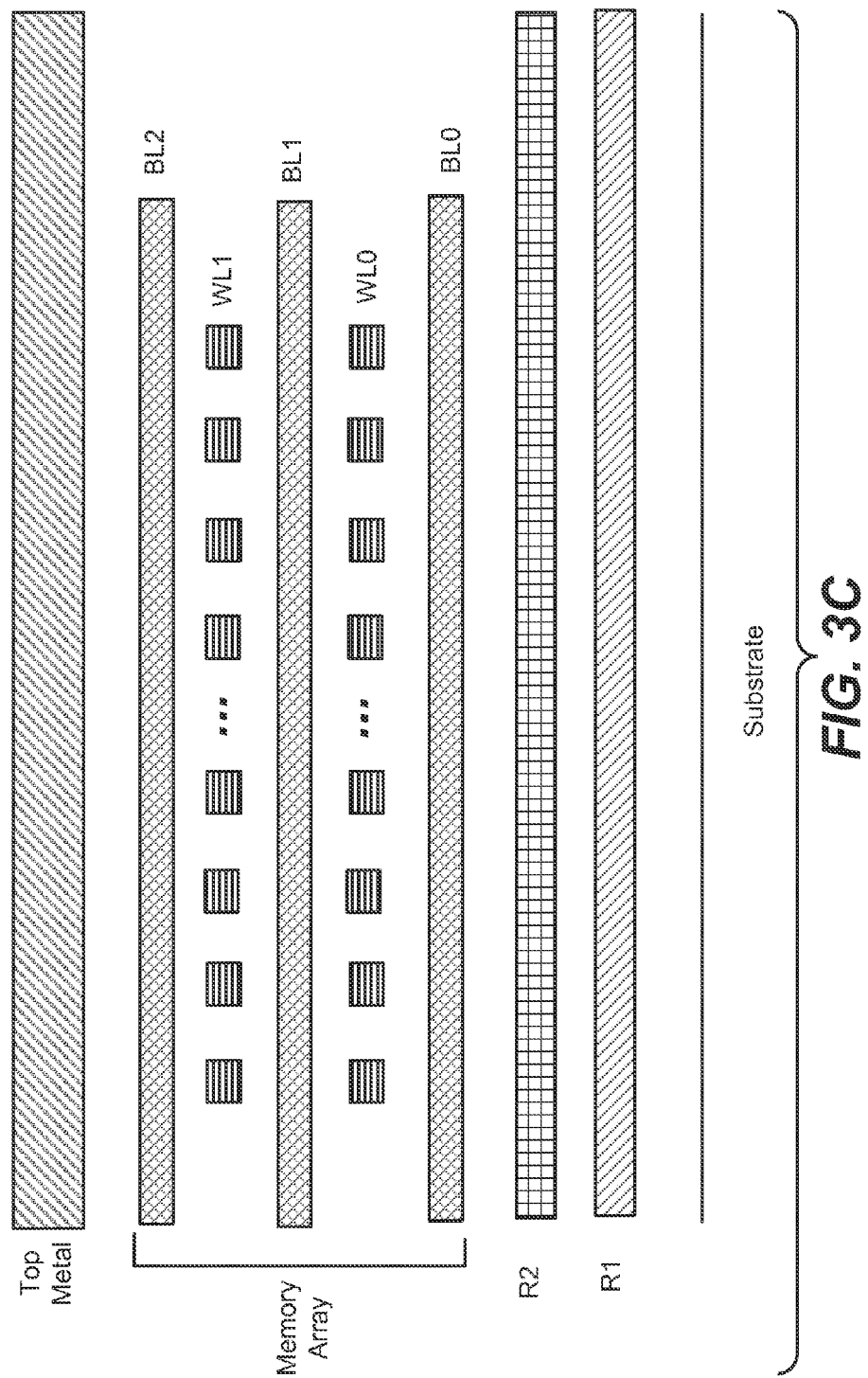
FIG. 3C depicts a subset of the memory array and routing layers of one embodiment of a three-dimensional memory array.

FIG. 3C depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional hit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3C, two metal layers R1 and R2 are used for routing layers; however, other embodiments can include more or less than two metal layers. In one example, these metal layers R1 and R2 are formed of tungsten (about 1 ohm/square). Positioned above the Memory Array layers may be one or more top metal layers used for routing signals between different components of the integrated circuit such as the Top Metal layer. In one example, the Top Metal layer is formed of copper or aluminum (about 0.05 ohms/square), which may provide a smaller resistance per unit area than layers R1 and R2. Metals layers R1 and R2 may not be implemented using the same materials as those used for the Top Metal layers because the metal used for R1 and R2 must be able to withstand the processing steps for fabricating the Memory Array layers on top of R1 and R2.

Figure 4:
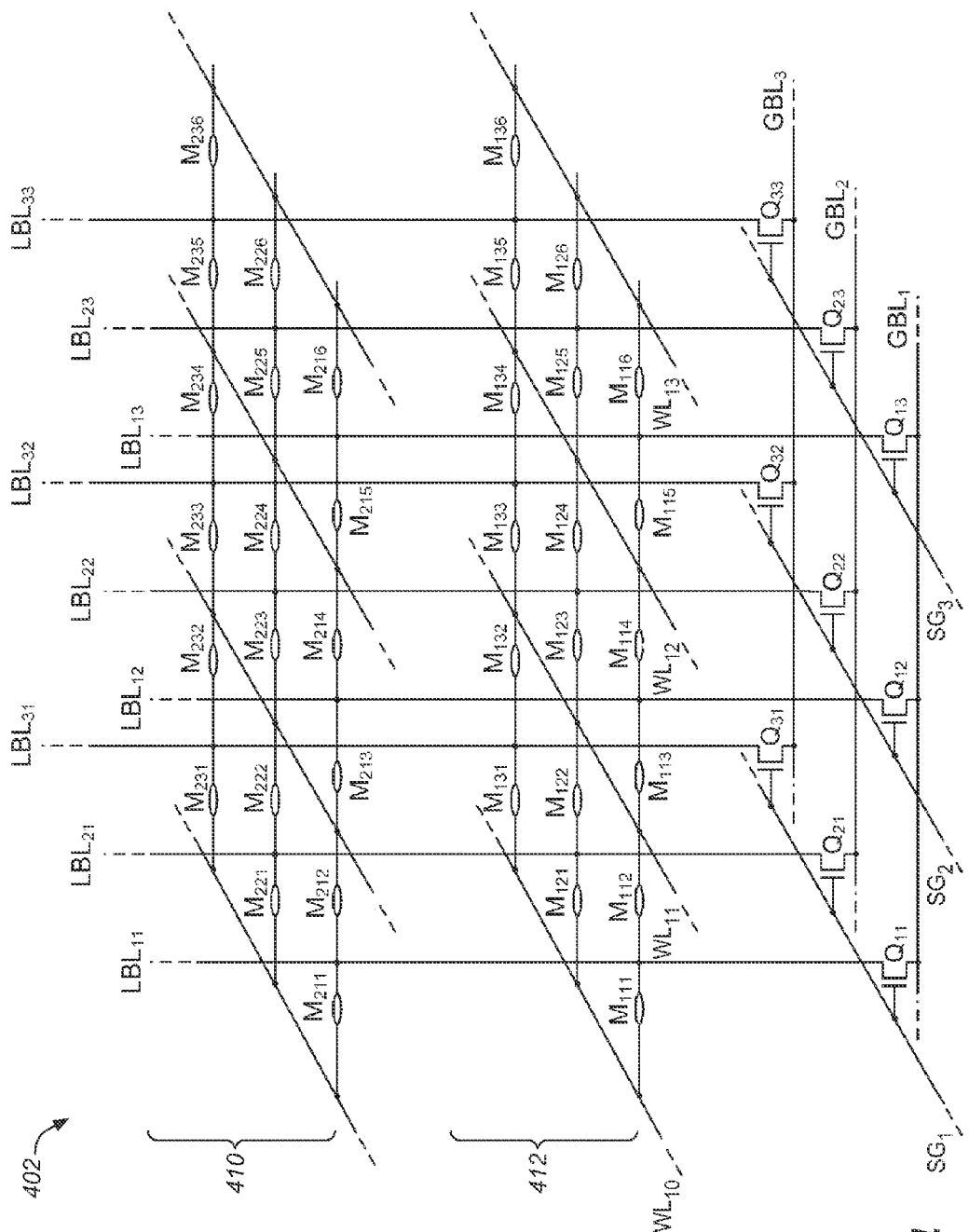
FIG. 4 depicts one embodiment of a portion of a monolithic three-dimensional memory array.

FIG. 4 depicts one embodiment of a portion of a monolithic three-dimensional memory array 402 that includes a first memory level 412 positioned below a second memory level 410. Memory array 402 is one example of an implementation for memory array 301 in FIG. 1E. The local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 402, includes a greater number of memory cells along the word lines as compared with the number of memory cells along the bit lines. For example, the number memory cells along each bit line may be 16, while the number of memory cells along each word line may be 2048. More information regarding the structure and operation of vertical bit line memory arrays can be found in U.S. Provisional Application 61/423,007, "Non-Volatile Memory Having 3D Array of Read/Write Elements With Vertical Bit Lines and Laterally Aligned Active Elements and Methods Thereof" and U.S. patent application Ser. No. 13/323,703, "Three Dimensional Non-Volatile Storage with Three Device Driver for Row Select," both of which are herein incorporated by reference in their entirety.

Figure 5:
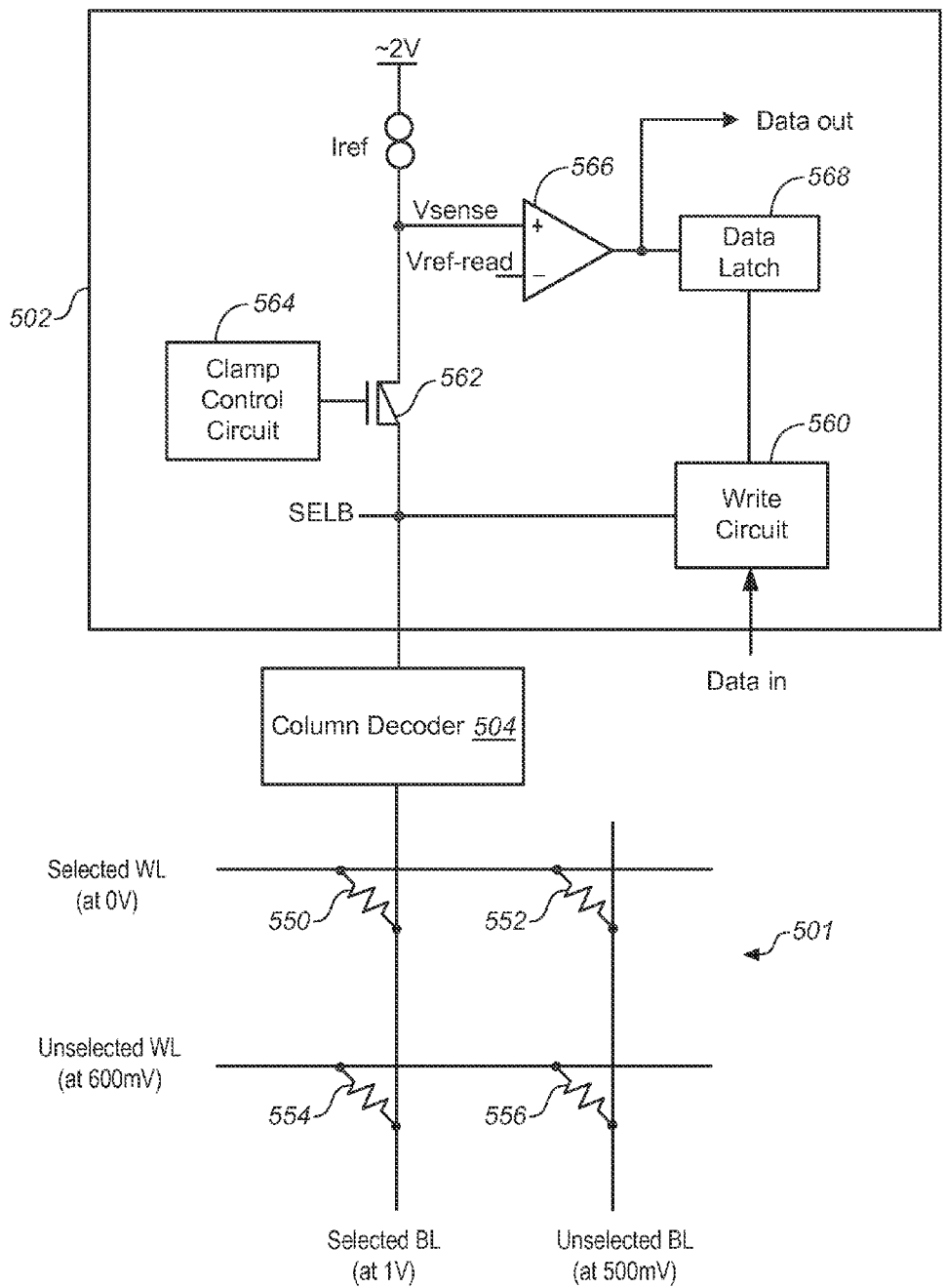
FIG. 5 depicts one embodiment of a read/write circuit along with a portion of a memory array.

FIG. 5 depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 3A. In another embodiment, the portion of a memory array 501 may comprise a memory array with bit lines arranged in a vertical direction that is perpendicular to the substrate, such as memory array 402 in FIG. 4. As depicted, the selected bit line is biased to 1V, the unselected word line is biased to 0.6V, the selected word line is biased to 0V, and the unselected bit line is biased to 0.5V.

In some embodiments, the selected bit line may be biased to 2.0V, the unselected word line may be biased to 2.0V, the selected word line may be biased to 0V, and the unselected bit line may be biased to 0V. In other embodiments, the memory array biasing scheme of FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 is electrically coupled to the selected bit line via column decoder 504. In one embodiment, column decoder 504 may correspond with column decoder 302 depicted in FIG. 1E. Transistor 562 couples node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the data in terminal, and data latch 568.

During a read operation, read/write circuit 502 biases the selected bit line to the selected bit line voltage in read mode. Prior to sensing data, read/write circuit 502 will precharge the Vsense node to 2V. When sensing data, read/write circuit 502 attempts to regulate the SELB node to 1V via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 will latch the output of sense amplifier 566 after a time period of sensing the current through the selected memory cell (e.g., 400 ns).

In one embodiment, during a write operation, if the data in terminal requests a data "0" to be written to a selected memory cell, then read/write circuit 502 biases SELB to the selected bit line voltage in write mode (e.g., 1.2V for a SET operation) via write circuit 560. The duration of programming the memory cell can be a fixed time period (e.g., using a fixed-width programming pulse) or variable (e.g., using a write circuit 560 that senses whether a memory cell has been programmed while programming). More information regarding write circuits that can sense while programming data can be found in U.S. Pat. No. 6,574,145, "Memory Device and Method for Sensing While Programming a Non-Volatile Memory Cell," incorporated herein by reference in its entirety. If the data in terminal requests a data "1" to be written, then write circuit 560 may bias SELB to the unselected bit line voltage in write mode (e.g., 0V for a SET operation). The write circuit 560 may also bias SELB to a program inhibit voltage in write mode that is different from the unselected bit line voltage.

Figure 6A:
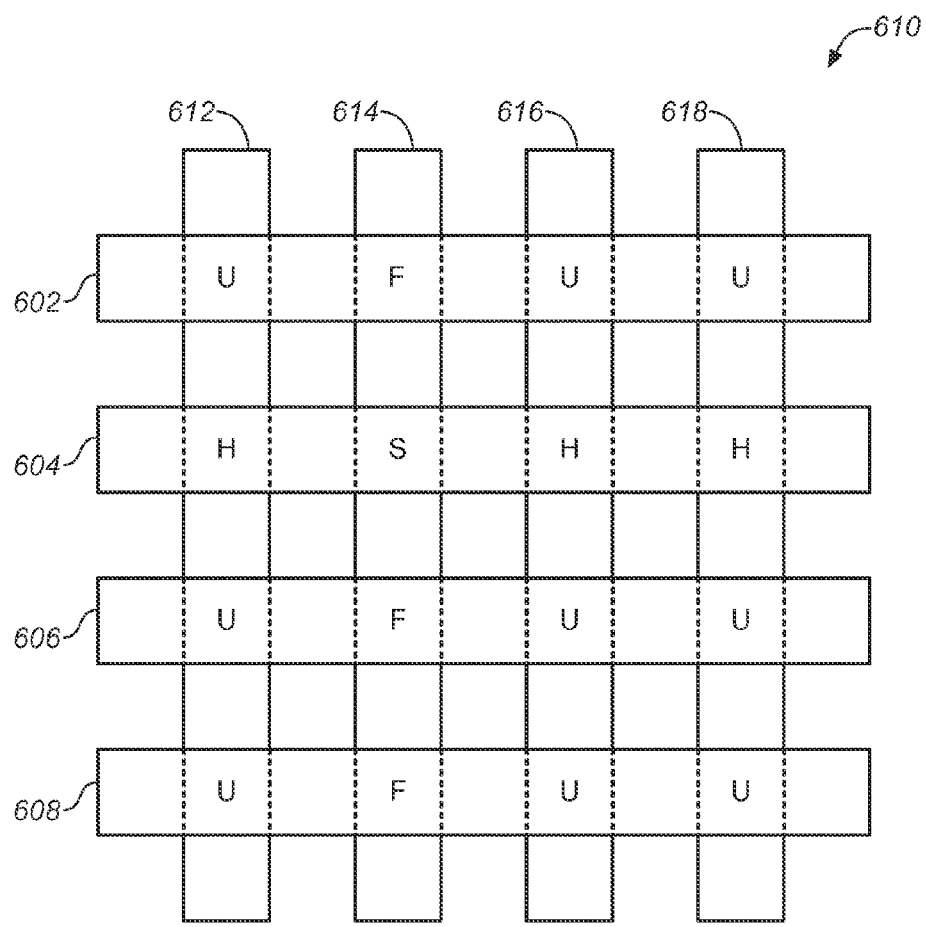
FIG. 6A depicts one embodiment of a cross-point memory array.

FIG. 6A depicts one embodiment of a cross-point memory array 610. The cross-point memory array 610 may correspond with memory array 201 in FIG. 3A or memory array 402 in FIG. 4. As depicted, cross-point memory array 610 includes word lines 602-608 and bit lines 612-618. Word line 604 comprises a selected word line and bit line 614 comprises a selected bit line. At the intersection of selected word line 604 and selected bit line 614 is a selected memory cell (an S cell). The voltage across the S cell is the difference between the selected word line voltage and the selected bit line voltage. Memory cells at the intersections of the selected word line 604 and the unselected bit lines 612, 616, and 618 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 614 and the unselected word lines 602, 606, and 608 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 602, 606, and 608 and the unselected bit lines 612, 616, and 618 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 602, may be associated with a particular page stored within the cross-point memory array 610.

Figure 6B:
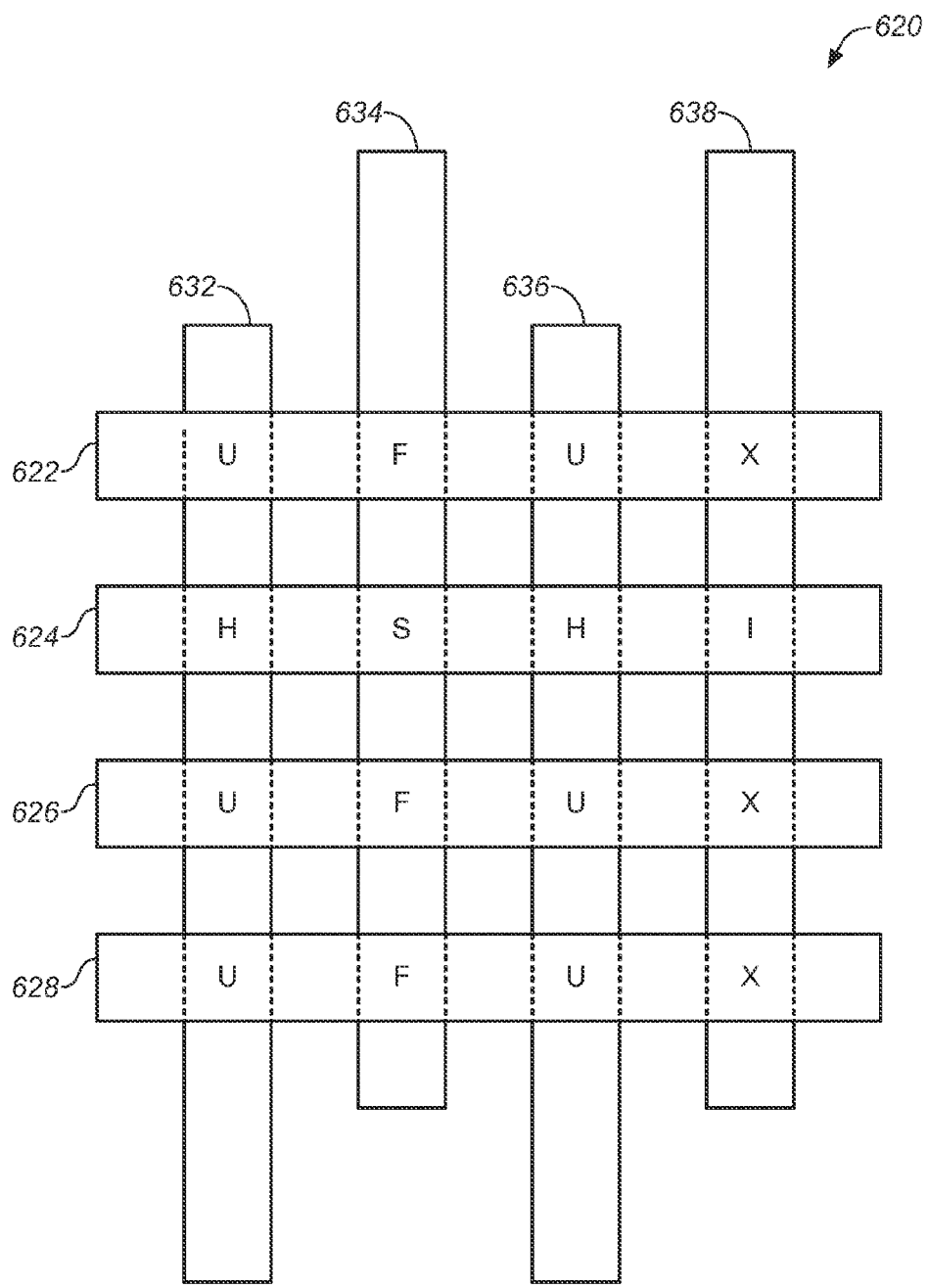
FIG. 6B depicts an alternative embodiment of a cross-point memory array.

FIG. 6B depicts an alternative embodiment of a cross-point memory array 620. The cross-point memory array 620 may correspond with memory array 201 in FIG. 3A or memory array 402 in FIG. 4. As depicted, cross-point memory array 620 includes word lines 622-628 and bit lines 632-638. Word line 624 comprises a selected word line and bit lines 634 and 638 comprise selected bit lines. Although both bit lines 634 and 638 are selected, the voltages applied to bit line 634 and bit line 638 may be different. For example, in the case that bit line 634 is associated with a first memory cell to be programmed (i.e., an S cell), then bit line 634 may be biased to a selected bit line voltage in order to program the first memory cell. In the case that bit line 638 is associated with a second memory cell that is not to be programmed (i.e., an I cell), then bit line 638 may be biased to a program inhibit voltage (i.e., to a bit line voltage that will prevent the second memory cell from being programmed).

At the intersection of selected word line 624 and selected bit line 638 is a program inhibited memory cell (an I cell). The voltage across the I cell is the difference between the selected word line voltage and the program inhibit voltage. Memory cells at the intersections of the selected bit line 638 and the unselected word lines 622, 626, and 628 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 638 may be similar to the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 622 may be associated with a first page and a second page. The first page may correspond with bit lines 632 and 636 and the second page may correspond with bit lines 634 and 638. In this case, the first page and the second page may correspond with interdigitated memory cells that share the same word line. When a memory array operation is being performed on the first page (e.g., a programming operation) and the selected word line 624 is biased to the selected word line voltage, one or more other pages also associated with the selected word line 624 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 620 may comprise resistive memory elements without isolating diodes. In another embodiment, a floating control line (e.g., bit line 636) comprises a portion of the memory array that may be undriven during an operation on memory cell S using a first selected control line (e.g., bit line 634). Selection devices connected to control line 636 may be turned off during the memory operation causing control line 636 to be floating. Since a portion of the memory cells connected to the control lines 634 and 636 are also connected to shared unselected second control lines 622, 626, and 628, the floating control lines will float to a voltage substantially the same as the voltage of the unselected second control lines. In one embodiment, the control lines 634 and 636 may comprise vertical bit lines in a three dimensional memory array comprising comb shaped word lines. More information regarding vertical bit line three dimensional memory arrays can be found in U.S. Provisional Application 61/526,764, "Optimized Architecture for Three Dimensional Non-Volatile Storage Device with Vertical Bit Lines" and U.S. patent application Ser. No. 13/323,573, "Three Dimensional Non-Volatile Storage with Multi Block Row Selection," both of which are herein incorporated by reference in their entirety.

Figure 7A:
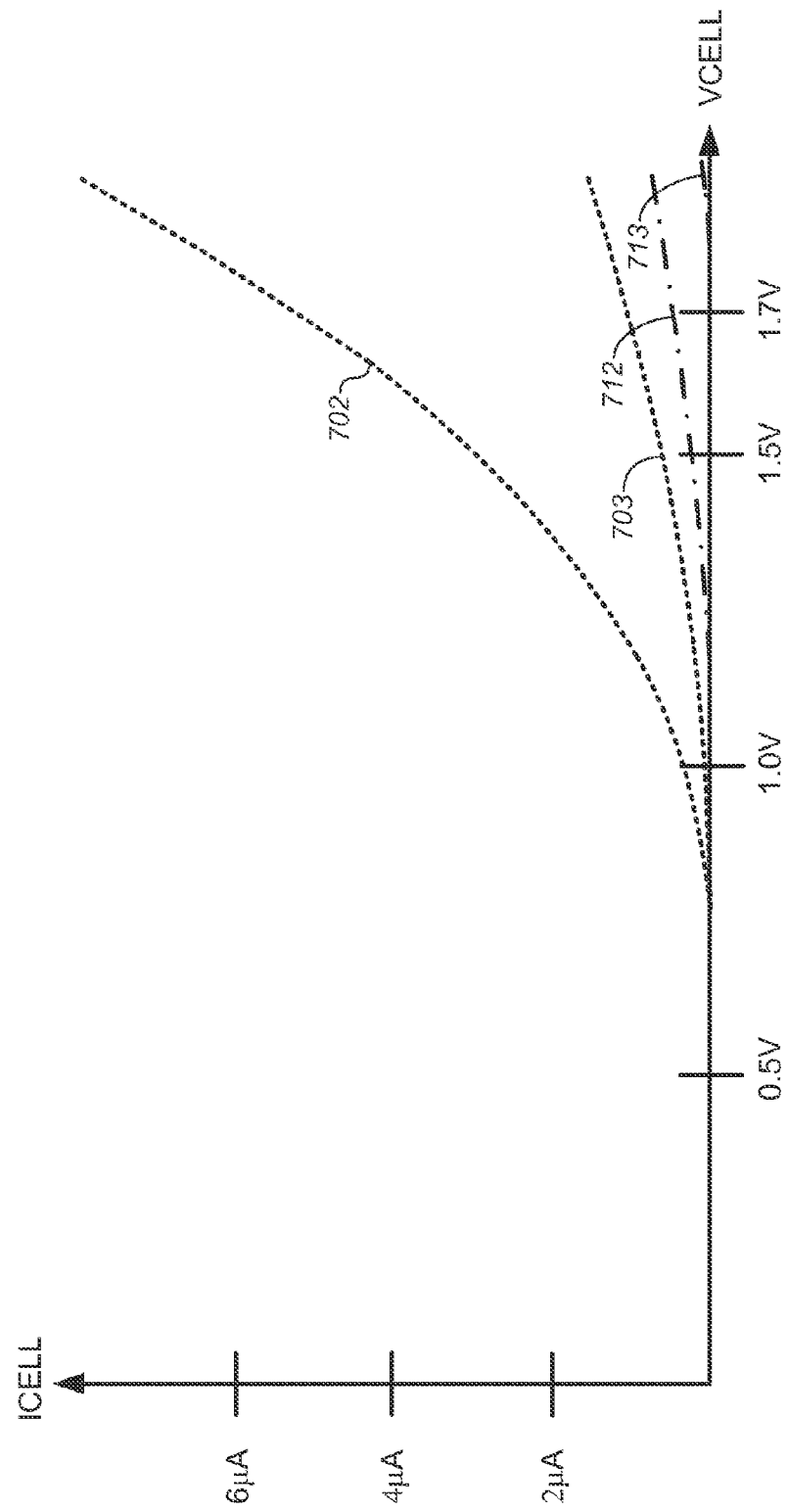
FIG. 7A depicts one embodiment of memory cell current distributions for memory cells programmed into an ON state and memory cells programmed into an OFF state over an applied memory cell voltage.

FIG. 7A depicts one embodiment of memory cell current distributions for memory cells programmed into an ON state (bounded by the lines 702-703) and memory cells programmed into an OFF state (bounded by lines 712-713) over an applied memory cell voltage (VCELL). As depicted, the memory cell current distribution for memory cells programmed into the ON state (e.g., one of the possible conducting states for a memory cell) is shown by a range bounded by lines 702-703, which comprise the boundaries of the expected variability for a given probability distribution (e.g., +/−4 sigma variation). In one example, the line 702 may correspond with memory cell I-V characteristics associated with a "strong" ON memory cell and the line 703 may correspond with memory cell I-V characteristics associated with a "weak" ON memory cell. The memory cell current distribution for memory cells programmed into the OFF state is shown by a range bounded by lines 712-713, which comprise the boundaries of the expected variability for a given probability distribution (e.g., +/−4 sigma variation). In one example, the line 712 may correspond with memory cell I-V characteristics associated with a "strong" OFF memory cell and the line 713 may correspond with memory cell I-V characteristics associated with a "weak" OFF memory cell.

As depicted, for a given VCELL (e.g., 1.7V applied across a memory cell), the output current (ICELL) associated with a "weak" ON memory cell is greater than the ICELL associated with a "strong" OFF memory cell. However, if the voltage applied across a "weak" ON memory cell is less than the voltage applied across a "strong" OFF memory cell (e.g., due to IR voltage drops along a bit line or a word line), then the ICELL associated with the "weak" ON memory cell may not be greater than the ICELL associated with the "strong" OFF memory cell. For example, if the VCELL applied to a "strong" OFF memory cell is 1.7V and the VCELL applied to a "weak" ON memory cell is 1.5V, then the output currents of both cells may be roughly equal; thus, in this case, the states of the two memory cells may not be distinguishable.

Figure 7B:
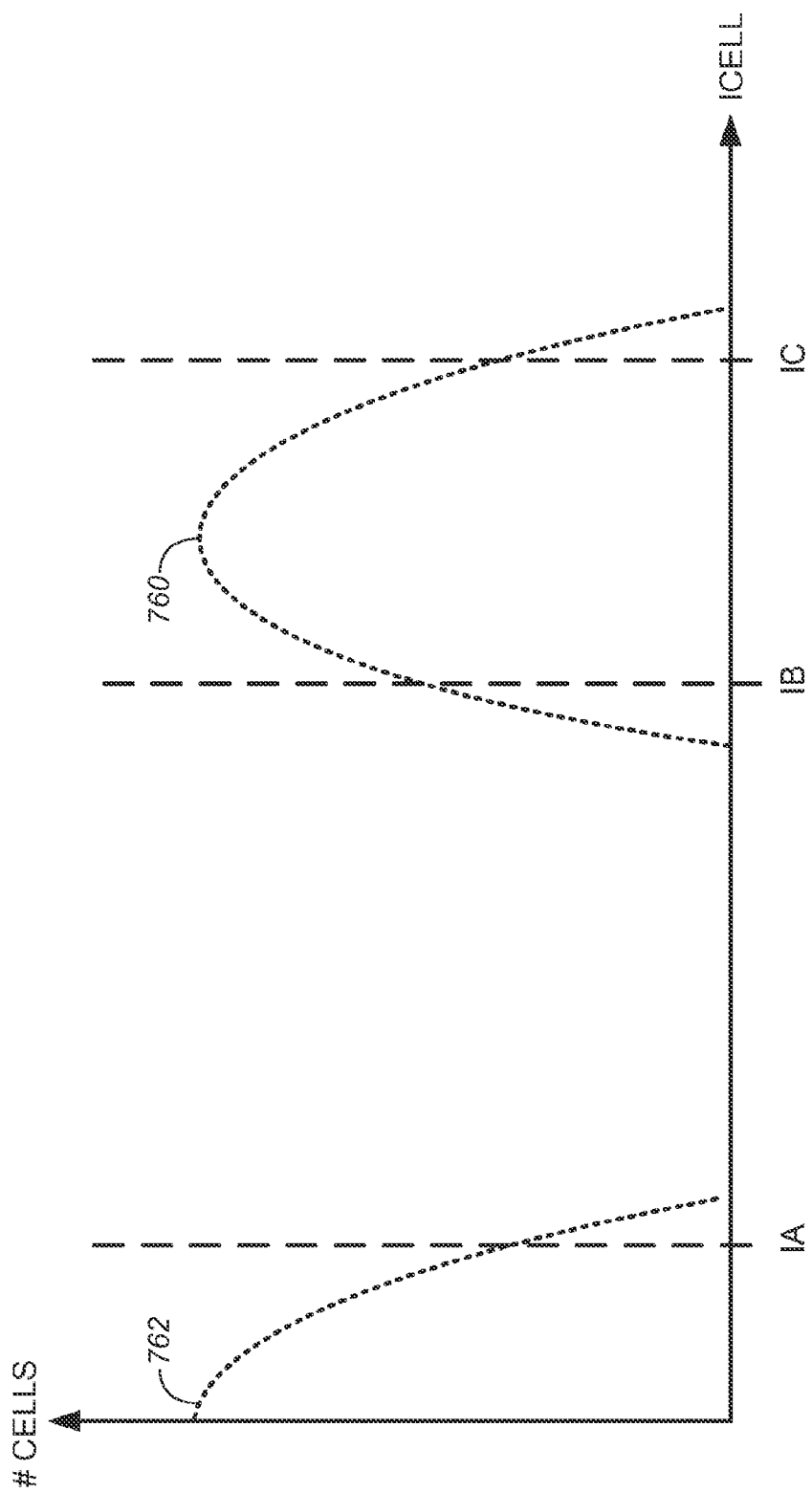
FIG. 7B depicts one embodiment of memory cell current distributions for memory cells programmed into an ON and memory cells programmed into an OFF state for a given memory cell bias voltage applied to the memory cells.

FIG. 7B depicts one embodiment of memory cell current distributions for memory cells programmed into an ON state (corresponding with memory cell current distribution 760) and memory cells programmed into an OFF state (corresponding with memory cell current distribution 762) for a given memory cell bias voltage applied to the memory cells (e.g., 1.7V applied across the memory cells). The ON state memory cells associated with output currents above an ICELL level of IC may be deemed "strong" ON memory cells and the ON state memory cells associated with output currents below an ICELL level of IB may be deemed "weak" ON memory cells. The ON state memory cells associated with output currents between the ICELL levels IB and IC may be deemed "typical" ON memory cells. Similarly, the OFF state memory cells associated with output currents above an ICELL level of IA may be deemed "strong" OFF memory cells.

In one embodiment, a particular memory cell may be determined to by in an ON state corresponding with the memory cell current distribution 760 using one or more sensing operations. To determine whether the particular memory cell is at a low end of a current distribution 760 associated with "weak" memory cells, an output current comparison with current level IB may be performed. To determine whether the particular memory cell is at a high end of the current distribution 760 associated with "strong" memory cells, an output current comparison with current level IC may be performed. Similarly, to determine whether a particular memory cell is at a high end of the current distribution 762 associated with "strong" memory cells, an output current comparison with current level IA may be performed.

Figure 8A:
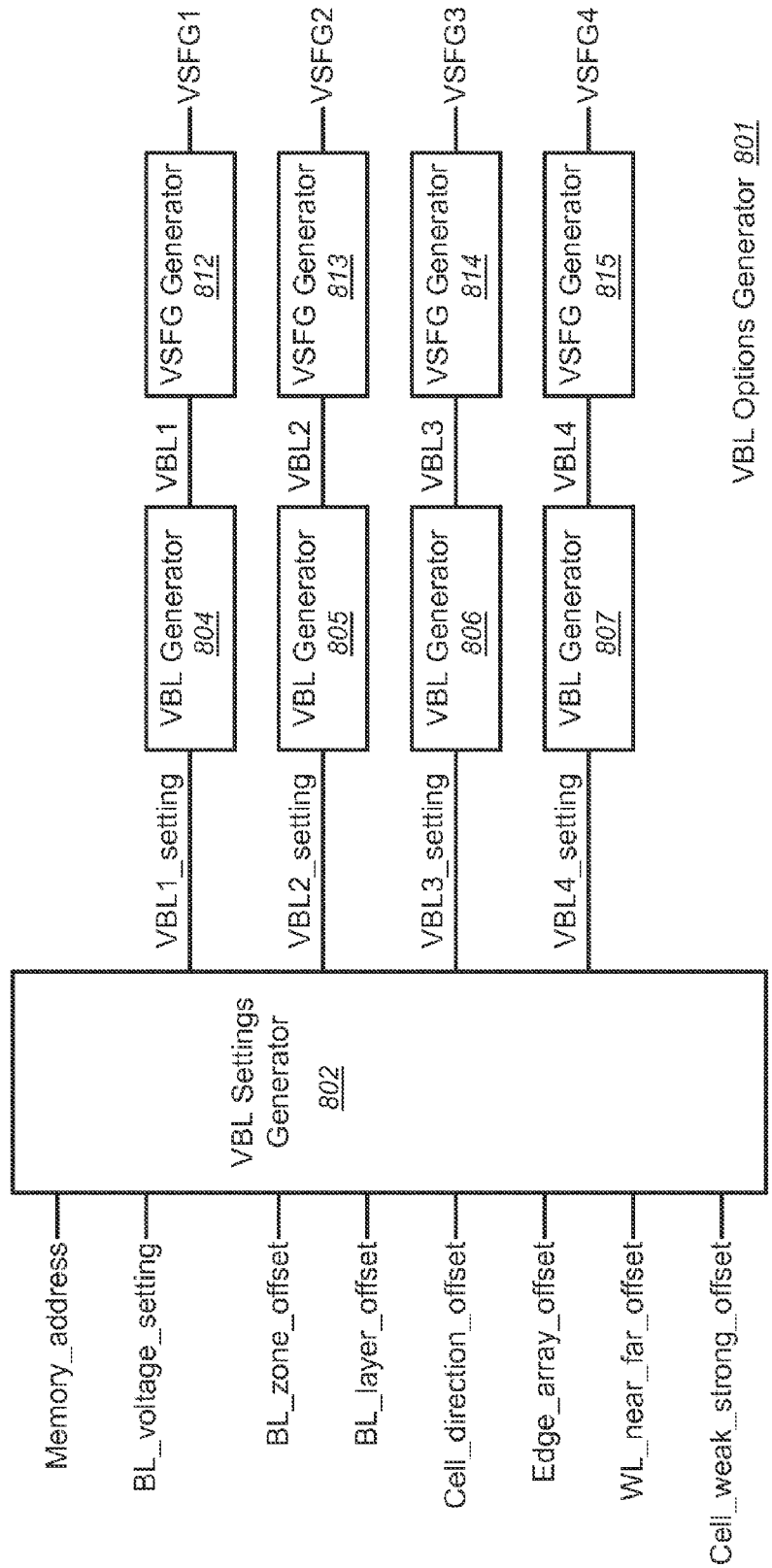
FIG. 8A depicts one embodiment of circuitry for generating a plurality of bit line voltage options.

FIG. 8A depicts one embodiment of circuitry for generating a plurality of bit line voltage options. Each voltage of the plurality of bit line voltage options may be used for generating a different selected bit line voltage. As depicted, the VBL options generator 801 includes a VBL settings generator 802, VBL generators 804-807, and VSFG generators 812-815. Each of the VBL generators 804-807 may comprise a non-inverting amplifier with a configurable resistor network (or ladder) that may be configured based on an input voltage setting. One example of a VSFG generator is depicted in FIG.

8B. The VBL settings generator 802 may include mapping logic or a state machine for generating a plurality of settings associated with a plurality of bit line voltages. In one embodiment, an uncompensated (or baseline) bit line voltage setting, BL_voltage_setting, may comprise a digital value used as the uncompensated voltage setting from which the plurality of settings may be determined. In one example, BL_voltage_setting may comprise a binary number associated with a selected bit line voltage during a read operation (e.g., 2V).

As depicted, the VBL settings generator 802 may take as inputs a memory address (e.g., comprising row and column addresses associated with a memory array), and various offset voltage settings including BL_zone_offset (an offset based on zones of a memory array for compensating for bit line resistance), BL_layer_offset (an offset based on the bit line layer), Cell_direction_offset (an offset based on the direction of a memory element or steering element), and Edge_array_offset (an offset based on whether a memory array is near an edge of a memory die). The memory address may be generated using an address decoder, such as address decoders 170 in FIG. 1B, and may include row address information and column address information for targeted memory cells in a memory array. The memory address may be used to determine the targeted memory array zone, the bit line layer, the memory cell direction, and whether the target memory array is an edge array. In some embodiments, a look-up table or combinational logic may be used to determine a compensated bit line voltage based on the memory address and the various offset voltage settings. In one example, a memory address corresponding with a near zone in a memory array, a third bit line layer, and an up cell direction may cause a BL_voltage_setting set to 2.0V to be mapped to a compensated bit line voltage of 2.25V.

As depicted, the VBL settings generator 802 may take as inputs WL_near_far_offset (offset values associated with whether a memory cell is located at a near end of a word line or a far end of the word line) and Cell_weak_strong_offset (offset values associated with whether a memory cell is a "strong" memory cell or a "weak" memory cell).

In one embodiment, if a memory cell is located at a far end of a word line, then the bit line voltage associated with the memory cell may be increased to compensate for additional IR drops along the word line. As both "near" bits and "far" bits may be read during a read operation or programmed during a programming operation, two compensated bit line voltages may be generated corresponding with a first compensated voltage to be applied to memory cells located at a near end of a word line and a second compensated voltage to be applied to memory cells located at a far end of the word line.

In one embodiment, if a memory cell is deemed to be a "weak" memory cell, then the bit line voltage associated with the memory cell may be increased to compensate for the reduced output current capability of the memory cell. As the determination of whether a memory cell is a "strong" memory cell or a "weak" memory cell must be made on a per memory cell basis, two compensated bit line voltages may be generated corresponding with a first compensated voltage to be applied to "strong" memory cells and a second compensated voltage to be applied to "weak" memory cells.

In some embodiments, four compensated bit line voltages (e.g., corresponding with VBL1-VBL4) may be generated corresponding with the four memory cell combinations associated with near/far memory cells and strong/weak memory cells. The VBL settings generator 802 may output binary values associated with the four compensated bit line voltages (e.g., VBL1_setting, VBL2_setting, VBL3_setting, and VBL4_setting) to four voltage generators for generating the four compensated bit line voltages. In some cases, the four compensated bit line voltages VBL1-VBL4 may be distributed to memory cell write circuitry for biasing selected bit lines during a programming operation.

In some embodiments, rather than outputting (or distributing) the four compensated bit line voltages directly to read/write circuits, such as read/write circuits 306 in FIG. 1D, four source-follower gate (SFG) voltages may be generated for driving transistors in a source-follower configuration for biasing selected bit lines, such as transistor 562 in FIG. 5.

Figure 8B:
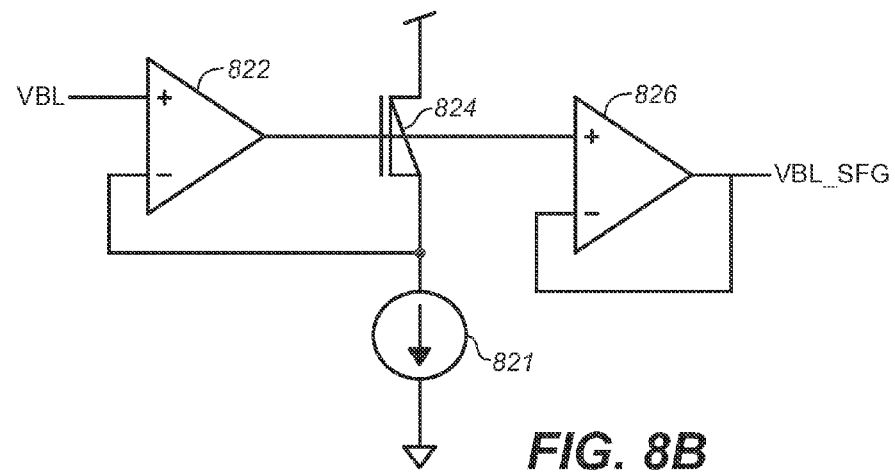
FIG. 8B depicts one embodiment of a VSFG generator.

FIG. 8B depicts one embodiment of a VSFG generator, such as VSFG generator 812 in FIG. 8A. The VSFG generator includes amplifier 822, transistor 824, amplifier 826, and reference current 821. The reference current 821 may be implemented using a current mirror and may be set to a value related to a minimum sensing current associated with a memory cell. As depicted, due to closed-loop feedback through amplifier 822, the source of transistor 824 may be regulated close to the input voltage VBL that is input to the amplifier 822. This will cause the gate of transistor 824 to be biased to an appropriate SFG voltage such that transistor 824 may source current associated with the reference current 821 using a source voltage close to the input voltage VBL. Amplifier 826 in a unity gain amplifier configuration may be used as a buffer to drive the output voltage VBL_SFG to one or more transistors, such as transistor 562 and FIG. 5.

Figure 8C:
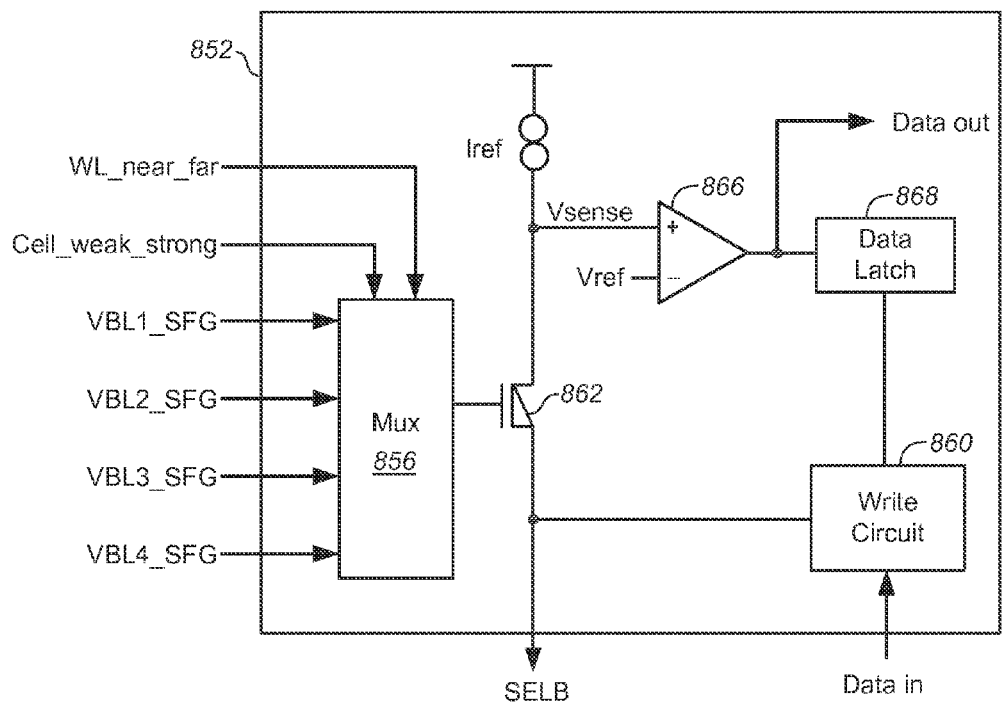
FIG. 8C depicts one embodiment of a read/write circuit.

FIG. 8C depicts one embodiment of a read/write circuit 852 for reading and/or writing a particular memory cell selected via a column decoder. Read/write circuit 852 is one example of an implementation of a read/write circuit included in read/write circuits 306 in FIG. 1D. In some embodiments, the capacitance associated with the SELB node (e.g., 3 pF) may be larger than the capacitance associated with the Vsense node (e.g., 100 fF) due to wiring capacitance and diffusion capacitance associated with connecting the SELB node to numerous column decoders. The read/write circuit 852 may comprise a memory cell sensing circuit for determining the state of a memory cell during a sensing operation. The read/write circuit 852 may also comprise a memory cell programming circuit for programming a memory cell using a bit line voltage selected from plurality of bit line voltage options.

As depicted, the SELB node of read/write circuit 852 is connected to the source of transistor 862 and write circuit 860. Transistor 862 couples node SELB to the Vsense node. Multiplexor (mux) 856 controls the gate of transistor 862, which may comprise a low VT nMOS device. The Vsense node is connected to the drain of transistor 862, a reference current Iref (which may be configurable), and one input of sense amplifier 866. The other input of sense amplifier 866 receives Vref, which is the voltage level used for comparing the Vsense node voltage during read and/or programming operations. The output of sense amplifier 866 is connected to the data out terminal and to data latch 868. Write circuit 860 is connected to node SELB, the data in terminal, and data latch 868.

As depicted, mux 856 takes as inputs four voltages VBL1_SFG, VBL2_SFG, VBL3_SFG, and VBL4_SFG associated with four different selected bit line voltages. The mux 856 selects one of the four input voltages to be connected to the gate of transistor 862 based on two select inputs WL_near_far (e.g., a single bit value associated with whether a selected memory cell is a "near" bit or a "far" bit) and Cell_weak_strong (e.g., a single bit value associated with whether a selected memory cell is a "strong" memory cell or a "weak" memory cell).

In one embodiment, four compensated bit line voltages are provided to a plurality of read/write circuits for per bit selection of the appropriate bit line voltage. In one example, during a programming operation, a read/write circuit may select the appropriate bit line voltage to apply based on whether the targeted memory cell is in a near zone or a far zone and/or whether the target memory cell is a "strong" memory cell or a "weak" memory cell. In another embodiment, four SFG voltages are provided to a plurality of read/write circuits for per bit selection of the appropriate SFG voltage used for applying an appropriate bit line voltage to a selected bit line. In some cases, mux 856 may be used for selecting an appropriate SFG voltage for driving transistor 862 during a read operation. In other cases, mux 856 may be used for selecting an appropriate SFG voltage for driving transistor 862 during a programming operation. During a programming operation, the write circuit 860 may also directly apply a selected bit line voltage from a plurality of bit line voltage options via a mux not depicted.

Figure 8D:
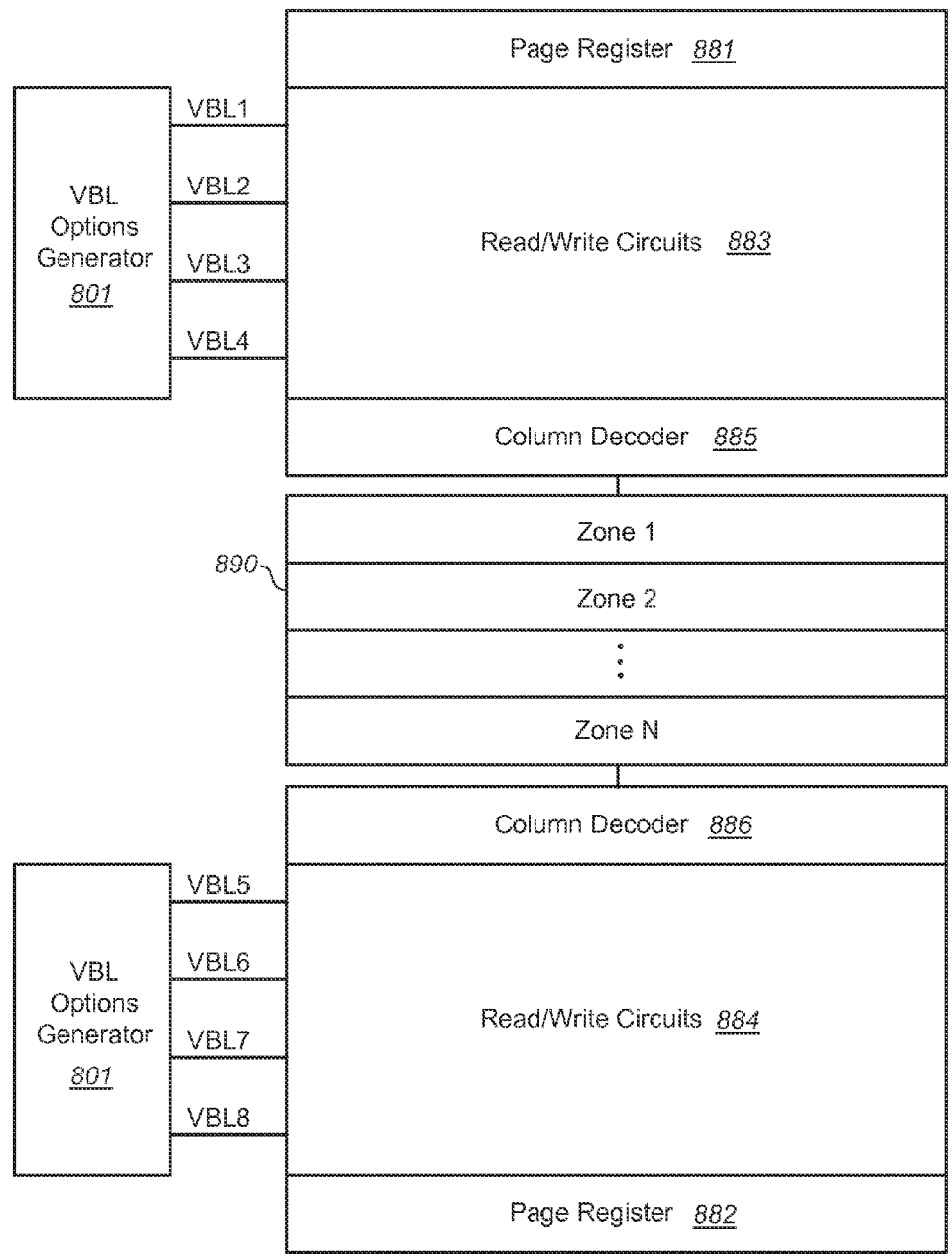
FIG. 8D depicts one embodiment of a portion of a memory core.

FIG. 8D depicts one embodiment of a portion of a memory core, such as memory core 103 in FIG. 1A. The memory core includes a top stripe, a memory array 890, and a bottom stripe. The top stripe includes a first VBL options generator 801 for generating four voltages VBL1-VBL4, a page register 881 (or data buffer), read/write circuits 883, and column decoder 885. The bottom stripe includes a second VBL options generator 801 for generating four voltages VBL5-VBL8, a page register 882 (or data buffer), read/write circuits 884, and column decoder 886. In some cases, the column decoder 885 may be used for selecting even bit lines and the column decoder 886 may be used for selecting odd bit lines.

Figure 9A:
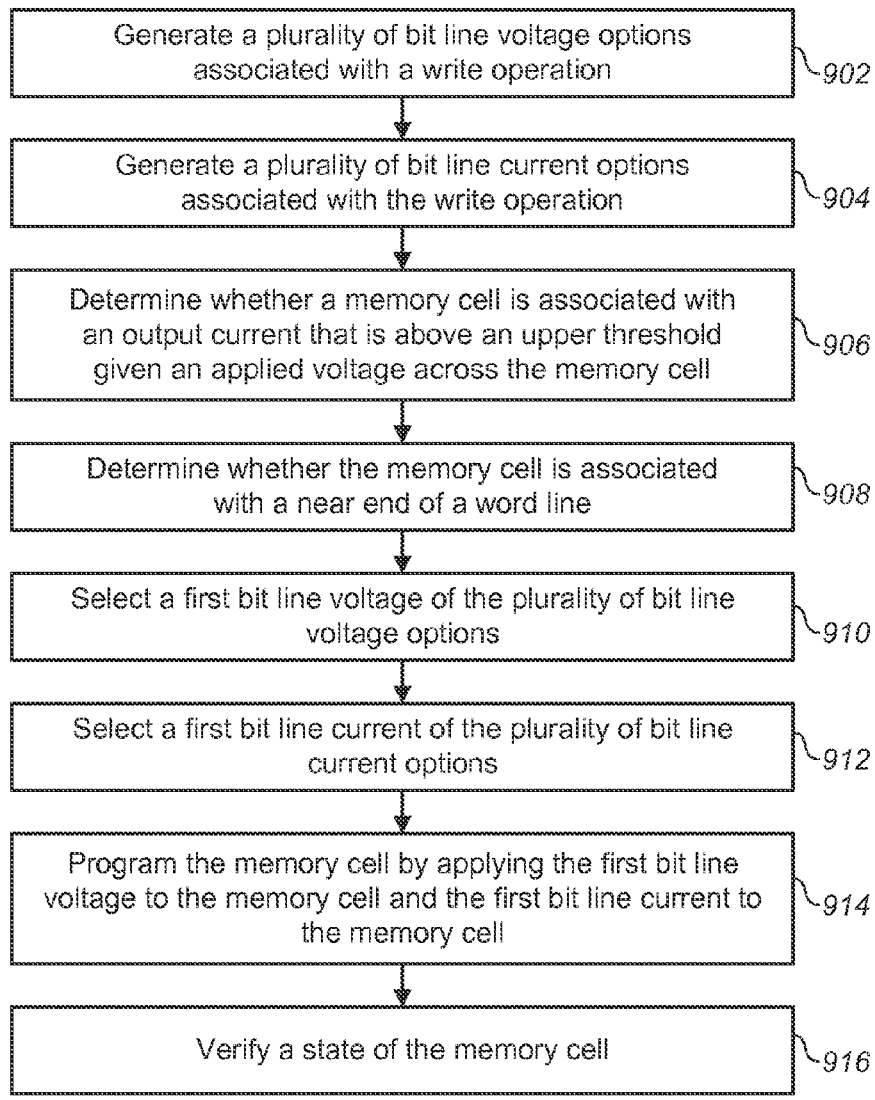
FIG. 9A is a flowchart describing one embodiment of a process for programming a memory cell.

As depicted, the memory array 890 may be broken into zones. In one example, each zone may be determined based on a range of row addresses or a range of word lines. The memory array 890 may be grouped into N zones, where Zone 1 is closest to read/write circuits 883 and Zone N is closest to read/write circuits 884. In this case, due to bit line resistance, memory cells located in Zone N may experience a larger IR drop along bit lines driven from read/write circuits 883 than memory cells located in Zone 1. Similarly, due to bit line resistance, memory cells located in Zone N may experience a smaller IR drop along bit lines driven from read/write circuits 884 than memory cells located in Zone 1. In one embodiment, the top stripe bit line voltages corresponding with VBL1-VBL4 may be different from the bottom stripe bit line voltages corresponding with VBL5-VBL8 to compensate for bit line resistance based on a target zone for targeted memory cells during a read and/or write operation. In one example, during a programming operation, VBL1-VBL4 may correspond with the voltages 6.0V, 6.15V, 6.3V, and 6.45V, respectively, while VBL5-VBL8 may correspond with the voltages 6.45V, 6.6V, 6.75V, and 6.9V, respectively FIG. 9A is a flowchart describing one embodiment of a process for programming a memory cell. In one embodiment, the process of FIG. 9A is performed by a memory chip, such as memory chip 102 in FIG. 1.

In step 902, a plurality of bit line voltage options associated with a write operation is generated. The plurality of bit line voltage options may be generated using a bit line voltage options generator, such as VBL options generator 801 in FIG. 8A. In one embodiment, the plurality of bit line voltage options may comprise four different bit line voltages corresponding with the four memory cell combinations associated with near/far memory cells and strong/weak memory cells. One embodiment of a process for generating a plurality of bit line voltages associated with different compensation options is described later in reference to FIG. 9B.

In step 904, a plurality of bit line current options associated with the write operation is generated. The plurality of bit line current options may be generated using control circuitry similar to the VBL settings generator 802 of FIG. 8A, but instead of binary values for different voltage settings being generated, the binary values may be generated for different current settings. A plurality of reference currents corresponding with the different current settings may be generated using a plurality of configurable current mirrors. Each of the plurality of configurable current mirrors may multiply a stable reference current (e.g., provided by a bandgap-based current reference) by some value depending on an input current setting. In one embodiment, the plurality of bit line current options may comprise two different bit line currents corresponding with a strong memory cell and a weak memory cell.

In step 906, it is determined whether a memory cell is associated with an output current that is above an upper threshold given an applied voltage across the memory cell. The memory cell may comprise one of a plurality of memory cells to be programmed during the write operation. In one embodiment, the determination of whether the memory cell is associated with an output current that is above an upper threshold includes determining a state of the memory cell, determining an upper current level associated with a "strong" memory cell in the state, and then comparing the output current with the upper current level associated with a "strong" memory cell in the state. If the output current is greater than the upper current level, then the memory cell may be deemed to be a "strong" memory cell.

In another embodiment, the determination of whether the memory cell is associated with an output current that is above an upper threshold includes determining whether the memory cell is an ON state, determining an upper current level associated with the ON state, and then comparing the output current of the memory cell with the upper current level. The determination of whether a memory cell to be written comprises a strong, weak, or typical memory cell may be performed for each of the memory cells to be written during the write operation. The memory cell specific determinations may then be stored as a memory cell strength vector in a memory buffer, such as a page register, prior to performing the write operation.

One embodiment of a process for determining whether a memory cell has characteristics of a strong memory cell, weak memory cell, or a typical memory cell is described later in reference to FIG. 9C.

In step 908, it is determined whether the memory cell is associated with a near end of a word line. In one embodiment, the determination of whether the memory cell is located at a near end of the word line may be determined based on a word line address associated with the memory cell. In some cases, a memory cell may be deemed to be at a near end of a word line if it is located within a certain distance of a word line driver driving the word line. In other embodiments, it is determined whether the memory cell is associated with a near-near memory cell (i.e., a memory cell with relatively small path resistance due to being located near the bit line biasing circuit and located near the word line biasing circuit) based on a word line address and a bit line address associated with the memory cell.

In step 910, a first bit line voltage of the plurality of bit line voltage options is selected. In one embodiment, the first bit line voltage may be selected based on the determination that the memory cell comprises a "strong" memory cell. In another environment, the first bit line voltage may be selected based on the determination that the memory cell comprises a "strong" memory cell and is located within a predetermined distance from a word line driver driving a word line connected to the memory cell (e.g., the memory cell comprises a near bit based on the word line address).

In some cases, a page register may store a one bit or two bit vector associated with characteristics of the memory cell, such as whether the memory cell has been determined to be a strong, weak, or typical memory cell. The selection of the first bit line voltage may be performed using a read/write circuit, such as read/write circuit 852 in FIG. 8C, that takes as a control input the vector stored in the page register. The two bit vector stored in the page register may also correspond with a first bit associated with whether the memory cell is deemed strong or typical and a second bit associated with whether the memory cell is deemed to be at a near end of a word line.

In step 912, a first bit line current of the plurality of bit line current options is selected. In one embodiment, the first bit line current may be selected based on the determination that the memory cell comprises a "strong" memory cell. In another environment, the first bit line current may be selected based on the determination that the memory cell comprises a "strong" memory cell and is located within a predetermined distance from a word line driver driving a word line connected to the memory cell (e.g., the memory cell comprises a near bit based on the word line address).

In step 914, the memory cell is programmed by applying the first bit line voltage to the memory cell and the first bit line current to the memory cell. In step 916, a state of the memory cell is verified to determine whether the memory cell has reached a particular programming state.

Figure 9B:
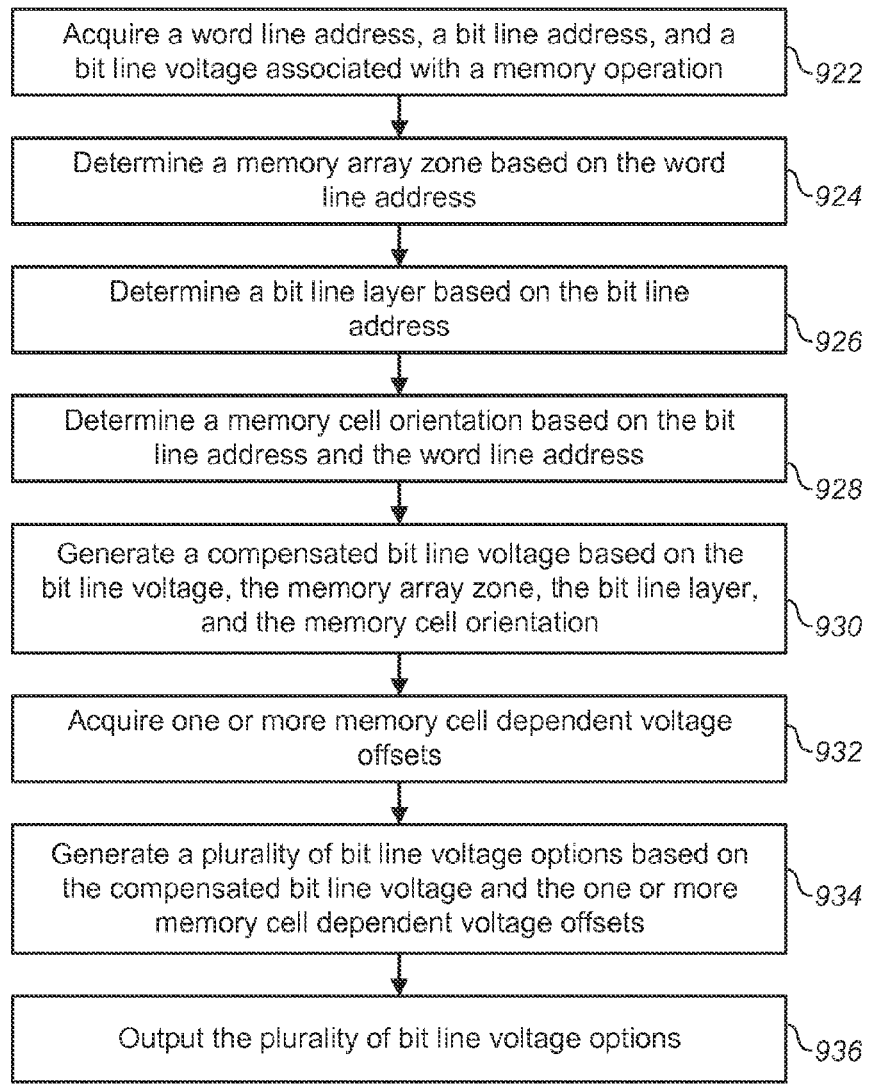
FIG. 9B is a flowchart describing one embodiment of a process for generating a plurality of bit line voltages associated with different compensation options.

FIG. 9B is a flowchart describing one embodiment of a process for generating a plurality of bit line voltages associated with different compensation options. The process described in FIG. 9B is one example of a process for implementing step 902 in FIG. 9A. In one embodiment, the process of FIG. 9B may be performed by a memory chip, such as memory chip 102 in FIG. 1.

In step 922, a word line address, a bit line address, and a bit line voltage associated with a memory operation are acquired. The bit line voltage may correspond with an uncompensated bit line voltage to be applied during the memory operation (e.g., 2V during a read operation). The memory operation may comprise a programming operation or a reading operation. In step 924, a memory array zone is determined based on the word line address. The word line address may determine the distance of a selected bit line to a corresponding bit line driver or read/write circuit biasing the selected line. In step 926, a bit line layer is determined based on the bit line address. In one embodiment, a memory array may comprise a monolithic three-dimensional memory array and the bit line layer may correspond with a memory layer of the monolithic three-dimensional memory array.

In step 928, a memory cell orientation is determined based on the bit line address and the word line address. In some memory array architectures, the memory cell orientation may be determined based solely on the bit line address. The memory cell orientation may correspond with a diode polarity or diode orientation (e.g., an upward pointing diode). In step 930, a compensated bit line voltage is generated based on the bit line voltage, the memory array zone, the bit line layer, and the memory cell orientation.

In step 932, one or more memory cell dependent voltage offsets are acquired. The one or more memory cell dependent voltage offsets may include an offset corresponding with whether the memory cell comprises a strong memory cell, a weak memory cell, or a typical memory cell. In one example, the bit line voltage offset for a memory cell that is deemed to be a strong memory cell may correspond with a reduction in the bit line voltage by 200 mV during a read operation. In another example, the bit line voltage offset for a memory cell that is deemed to be a strong memory cell may correspond with an increase in the bit line voltage by 500 mV during a programming operation.

In step 934, a plurality of bit line voltage options is generated based on the compensated bit line voltage and the one or more memory cell dependent voltage offsets. In one embodiment, the plurality of bit line voltage options may be generated using a plurality of voltage regulators each generating an output voltage corresponding with the compensated bit line voltage and one of the one or more memory cell dependent voltage offsets. In step 936, the plurality of bit line voltage options is outputted. The plurality of bit line voltage options may be distributed across a plurality of read/write circuits used for generating bit line voltages during the memory operation.

Figure 9C:
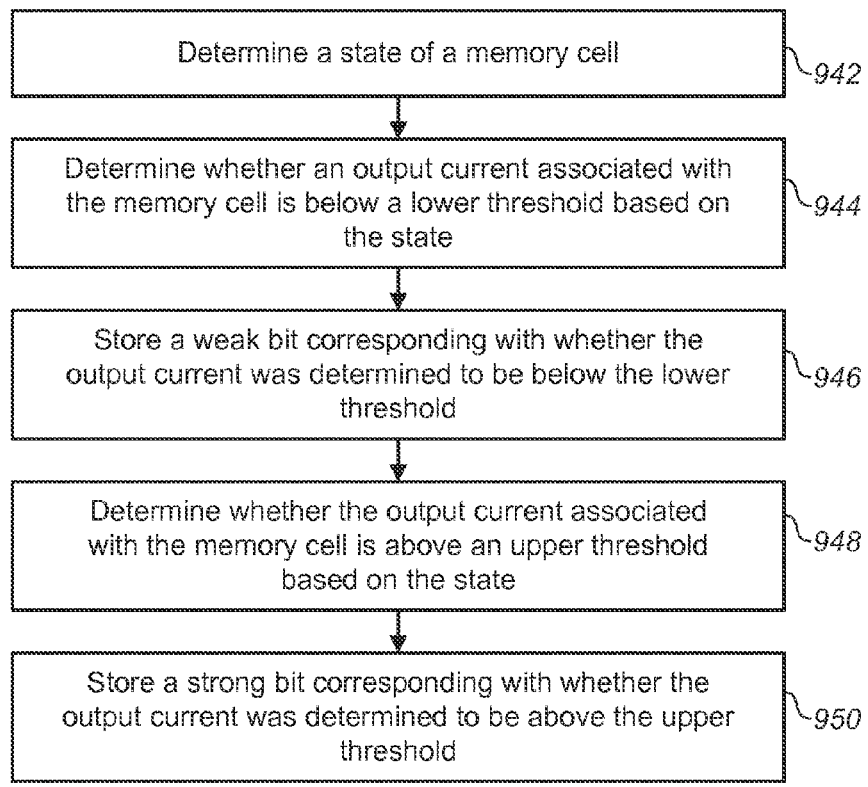
FIG. 9C is a flowchart describing one embodiment of a process for determining whether a memory cell has characteristics of a strong memory cell, a weak memory cell, or a typical memory cell.

FIG. 9C is a flowchart describing one embodiment of a process for determining whether a memory cell has characteristics of a strong memory cell, a weak memory cell, or a typical memory cell. The process described in FIG. 9C is one example of a process for implementing step 906 in FIG. 9A. In one embodiment, the process of FIG. 9C may be performed by a memory chip, such as memory chip 102 in FIG. 1.

In step 942, a state of the memory cell is determined. The state of the memory cell may be determined via one or more memory cell sensing operations. The state of the memory cell may correspond with a programmed state of the memory cell (e.g., an ON state of the memory cell). In step 944, it is determined whether an output current associated with the memory cell is below (or less than) a lower threshold based on the state. In one example, the state of the memory cell may correspond with the ON state depicted in FIG. 7B and the lower threshold may correspond with the current level IB depicted in FIG. 7B. In step 946, a weak bit corresponding with whether the output current was determined to be below the lower threshold is stored. The weak bit may be stored in a page register.

In step 948, it is determined whether the output current associated with the memory cell is above (or greater than) an upper threshold based on the state. In one example, the state of the memory cell may correspond with the ON state depicted in FIG. 7B and the upper threshold may correspond with the current level IA depicted in FIG. 7B. In step 950, a strong bit corresponding with whether the output current was determined to be above the upper threshold is stored. The strong bit may be stored in a page register. In some cases, if neither the strong bit nor the weak bit are set to "1," then the memory cell may be deemed a typical memory cell.

Figure 9D:
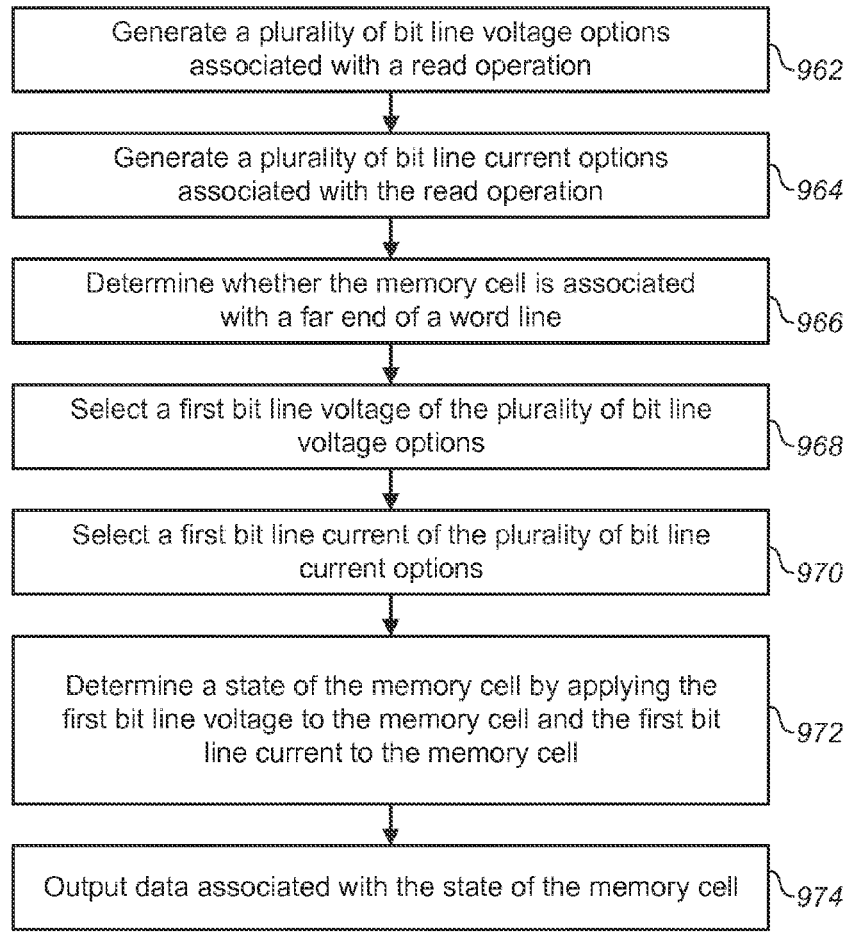
FIG. 9D is a flowchart describing one embodiment of a process for reading a memory cell.

FIG. 9D is a flowchart describing one embodiment of a process for reading a memory cell. In one embodiment, the process of FIG. 9D is performed by a memory chip, such as memory chip 102 in FIG. 1.

In step 962, a plurality of bit line voltage options associated with a read operation is generated. The plurality of bit line voltage options may be generated using a bit line voltage options generator, such as VBL options generator 801 in FIG. 8A. In one embodiment, the plurality of bit line voltage options may comprise two different bit line voltages corresponding whether a memory cell is located at a far end of a word line or not located at the far end of the word line. One embodiment of a process for generating a plurality of bit line voltages associated with different compensation options was described previously in reference to FIG. 9B.

In step 964, a plurality of bit line current options associated with the read operation is generated. The plurality of bit line current options may be generated using control circuitry similar to the VBL settings generator 802 of FIG. 8A, but instead of binary values for different voltage settings being generated, the binary values may be generated for different current settings. A plurality of reference currents corresponding with the different current settings may be generated using a plurality of configurable current mirrors. Each of the plurality of configurable current mirrors may multiply a stable reference current (e.g., provided by a bandgap-based current reference) by some value depending on a given input current setting. In one embodiment, the plurality of bit line current options may comprise two different bit line currents corresponding with a strong memory cell and a weak memory cell.

In step 966, it is determined whether the memory cell is associated with a far end of a word line. In one embodiment, the determination of whether the memory cell is located at a far end of the word line may be determined based on a word line address associated with the memory cell. In other embodiments, it may be determined whether the memory cell is associated with a far-far memory cell (i.e., a memory cell with relatively large path resistance due to being located far from the bit line biasing circuit and located far from the word line biasing circuit) based on a word line address and a bit line address associated with the memory cell. In some cases, a memory cell may be deemed to be far from the end of a word line if it is located more than a certain distance from a word line driver driving the word line.

In step 968, a first bit line voltage of the plurality of bit line voltage options is selected. In one embodiment, the first bit line voltage may be selected based on the determination that the memory cell comprises a "strong" memory cell. In another environment, the first bit line voltage may be selected based on the determination that the memory cell comprises a "strong" memory cell and is located more than a predetermined distance from a word line driver driving a word line connected to the memory cell (e.g., the memory cell comprises a far bit based on the word line address).

In some cases, a page register may store a one bit or two bit vector associated with characteristics of the memory cell, such as whether the memory cell has been determined to be a strong, weak, or typical memory cell. The selection of the first bit line voltage may be performed using a read/write circuit, such as read/write circuit 852 in FIG. 8C, that takes as a control input the vector stored in the page register. The two bit vector stored in the page register may also correspond with a first bit associated with whether the memory cell is deemed strong or typical and a second bit associated with whether the memory cell is deemed to be at a near end of a word line.

In step 970, a first bit line current of the plurality of bit line current options is selected. In one embodiment, the first bit line current may be selected based on the determination that the memory cell comprises a "strong" memory cell. In another environment, the first bit line current may be selected based on the determination that the memory cell comprises a "strong" memory cell and is located more than a predetermined distance from a word line driver driving a word line connected to the memory cell (e.g., the memory cell comprises a far bit based on the word line address).

In step 972, a state of the memory cell is determined by applying the first bit line voltage to the memory cell and the first bit line current to the memory cell. The state of the memory cell may be determined by performing a sensing or read operation on the memory cell using a read/write circuit, such as read/write circuit 852 in FIG. 8C. In step 974, data associated with the state of the memory cell is outputted. The data associated with the state of the memory cell may be outputted to a page register for buffering prior to transmission of the data outside of a memory chip.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" are used to described different embodiments and do not necessarily refer to the same embodiment.

For purposes of this document, a connection can be a direct connection or an indirect connection (e.g., via another part).

For purposes of this document, the term "set" of objects, refers to a "set" of one or more of the objects.

Charge Pump with a Power-Controlled Clock Buffer

This section considers the on-chip generation of voltages levels, such as would be used on the memory circuits described above. Non-volatile memory system, both those described above and also more generally, often require operating voltages higher than their supply levels. To generate these voltages, charge pump circuits are often employed. This section considers embodiments of charge pumps that can be advantageously employed in the sort of memory devices above as well as in other applications. In particular, the following presents a charge pump system with a power-controller clock buffer to reduce power consumption and output voltage ripple.

The following is primarily concerned with the regulation circuitry of charge pump systems rather than the details of the pump itself. For example, the pump can be based on a Dickson-type pump, voltage doublers, four-phase, and so on. More detail on various pumps and pump system within which the following concepts can be applied can be found, for example, in "Charge Pump Circuit Design" by Pan and Samaddar, McGraw-Hill, 2006, or "Charge Pumps: An Overview", Pylarinos and Rogers, Department of Electrical and Computer Engineering University of Toronto, available on the webpage "www.eecg.toronto.edu/~kphang/ece1371/chargepumps.pdf". Further information on various other charge pump aspects and designs can be found in U.S. Pat. Nos. 5,436,587; 6,370,075; 6,556,465; 6,760,262; 6,922,096; 7,030,683; 7,554,311; 7,368,979; 7,795,952; 7,135,910; 7,973,592; and 7,969,235; US Patent Publication numbers 2009-0153230-A1; 2009-0153232-A1; 2009-0315616-A1; 2009-0322413-A1; 2009-0058506-A1; US-2011-0148509-A1; 2007-0126494-A1; 2007-0139099-A1; 2008-0307342 A1; 2009-0058507 A1; 2012-0154023; 2012-0154022; and 2013-0063118; and U.S. patent application Ser. Nos. 13/618,482; 13/628,465; 13/886,066; 13/921,072; 13/926,442; and 13/929,197.

Figure 10:
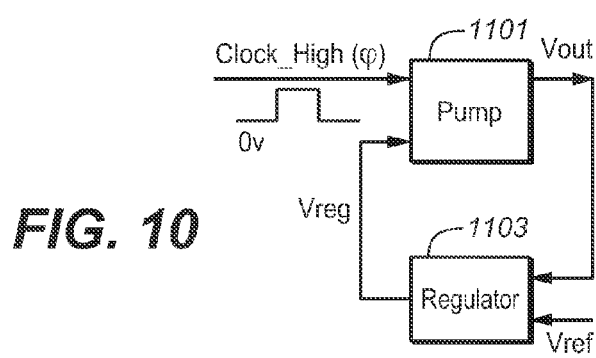
FIG. 10 is a simplified top-level block diagram of a typical charge pump using an output voltage based regulation scheme.

With respect to regulation, FIG. 10 is a simplified top-level block diagram of a typical charge pump using an output voltage based regulation scheme. As shown in FIG. 10, the pump 1001 has as inputs a clock signal and a voltage Vreg and provides an output Vout. The clock generation circuit is not explicitly shown in FIG. 10, although it may be considered part of the charge pump system in some embodiments or taken as an external input. The high (Vdd) and low (ground) connections are also not explicitly shown. The voltage Vreg is provided by the regulator 1003, which has as inputs a reference voltage Vref from an external voltage source and the output voltage Vout. The regulator block 1003 generates feedback control signal Vreg such that the desired value of Vout can be obtained. The pump section 1001 may have any of various designs for charge pumps, such as described in the various references cited above including charge doubler-type circuits with cross-coupled elements as well as the Dickson-type pumps described below for the exemplary embodiments. (A charge pump is typically taken to refer to both the pump portion 1001 and the regulator 1003, when a regulator is included, although in some usages "charge pump" refers to just the pump section 1001. In the following, the terminology "charge pump system" will often be used to describe pump itself as well as any regulation or other peripheral elements.) The regulator block 1003 typically compares the Vref to the Vout value by using a voltage divider circuit. The voltage divider can be a resistive divider, a capacitive divider, or some combination (see, for example, U.S. Pat. No. 7,554,311).

Figure 11:
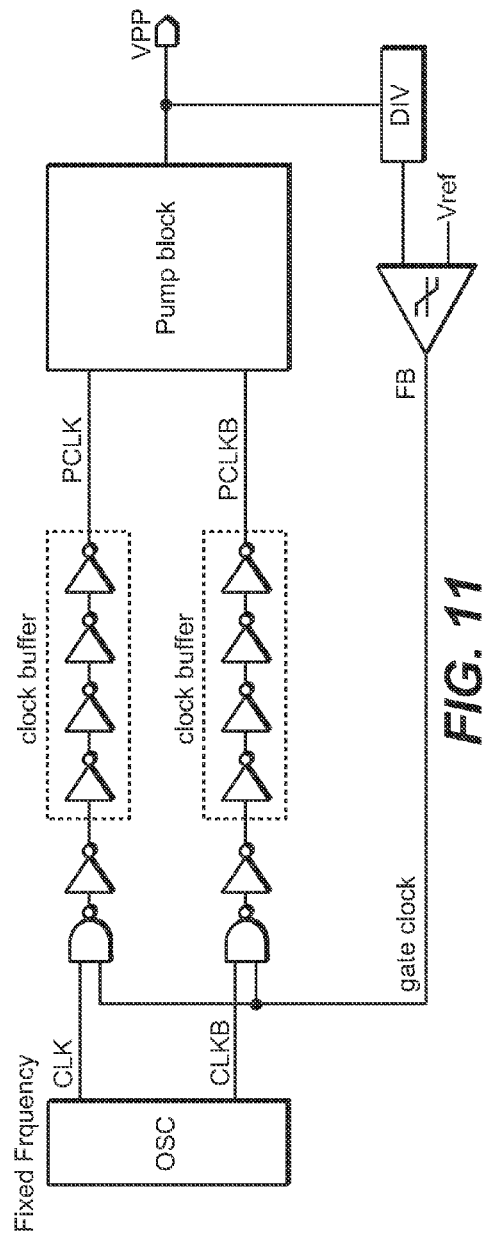
FIG. 11 is a charge pump system using a gated clock strategy.

Considering regulation in more detail, one way to regulate a charge pump system is regulating the clock save power consumption and keep the pump output at a specified value. One strategy used in pump clock regulation compares the pump output with a reference voltage and generates a feed-back control signal FB. The FB will be used to gate the oscillator (OSC) output clock, so the pump feed-in clock (CLKIN and CLKINB) will be turn on/off depends on the pump output level. FIG. 11 illustrates some detail. Here the oscillator block OSC provides a pair of non-overlapping clock signals CLK and CLKB to the pump block through respective clock buffers, here made up of a series of inverters. The clock signals are gates with the feedback signal FB from a comparator whose inputs are a reference voltage Vref and feedback of the output voltage VPP taken from a voltage divider. The output of the buffers is then the pair of gated clock signals PCLK and PCLKB.

Figure 12:
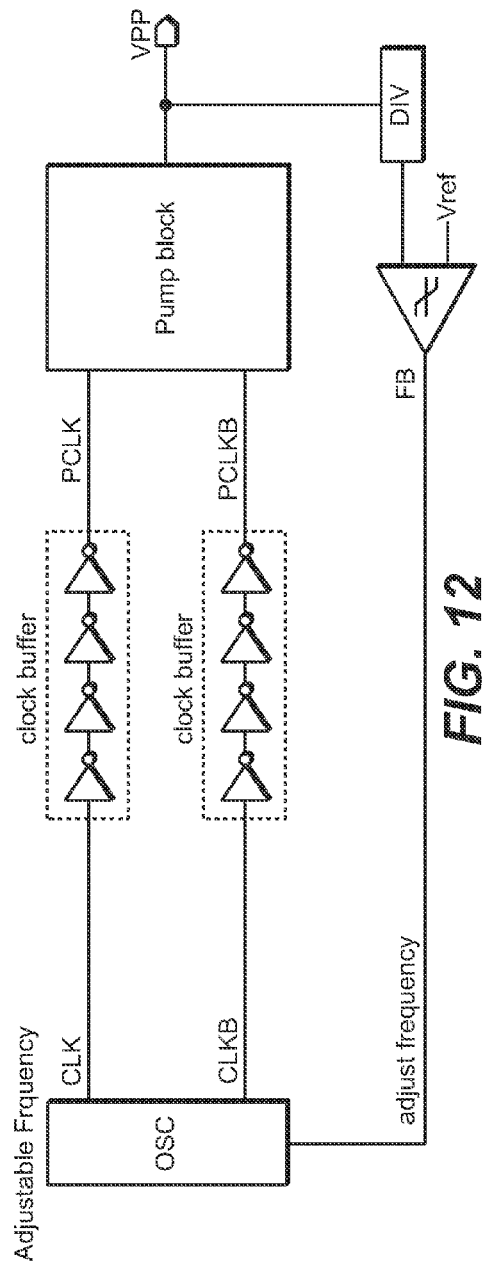
FIG. 12 is a charge pump system using an adjustable clock frequency regulation strategy.

Another strategy uses the feed-back control signal FB to adjust the oscillator output clock frequency, if the pump output is too high the clock frequency will go slow, otherwise the clock frequency will go fast. FIG. 12 illustrates this arrangement, where the feedback FB is supplied to the OSC block. Some combination of the strategies of FIGS. 11 and 12 can also be used to do pump clock regulation but the theory is still the same.

Figure 13:
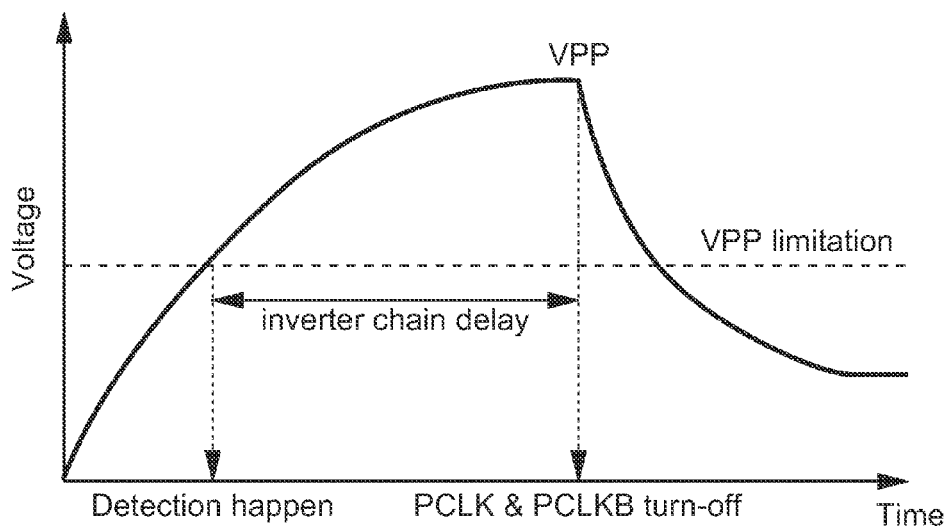
FIG. 13 illustrates gated clock regulation ripple.
Figure 14:
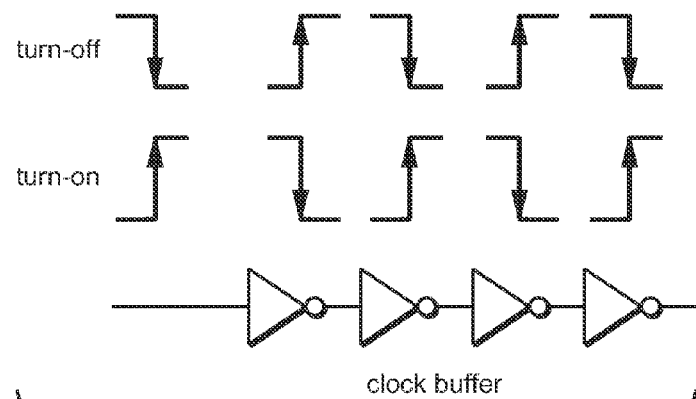
FIG. 14 illustrates inverter switching in a clock buffer.
Figure 15:
FIG. 15 shows a pump clock regulated by a gated clock strategy.

Considering the arrangement of FIG. 11 in more detail, the pump feed-in clocks PCLK and PCLKB are digital signals, whose values are either VSS or VDD. Since the PCLK and PCLKB will be directly coupled to the pump's charging capacitor, the VDD signal level can make it difficult to reduce the pump output ripple. The clock buffer typically contains a long inverter chain, which will introduce considerable timing delay. Whenever the circuit has detected that the pump output voltage is too high/too low, it will take a number of cycles for the pump clock PCLK and PCLKB to be really turned off/on (see FIG. 13), making it even harder to reduce the pump output ripple. Since the feed-back control signal FB is used to turn on/off the pump feed-in clock, whenever there is a turn on/off occurrence, every inverter in the clock buffer will experience a switching (see FIG. 14). The multiple inverter switching can lead to transient current that are difficult to control in the clock buffer and cause non-negligible power loss. This situation will even be worse if the clock buffer device size is large and the circuits turn on/off the pump feed-in clock frequently. In many RF and high-speed applications, the system will only allow for period signals whose frequency is the integer multiplier of system clock frequency. The pump clock generated with the gated clock regulate strategy is a variant-frequency clock signal (see FIG. 15), which will be unfavorable in these applications.

Figure 16:
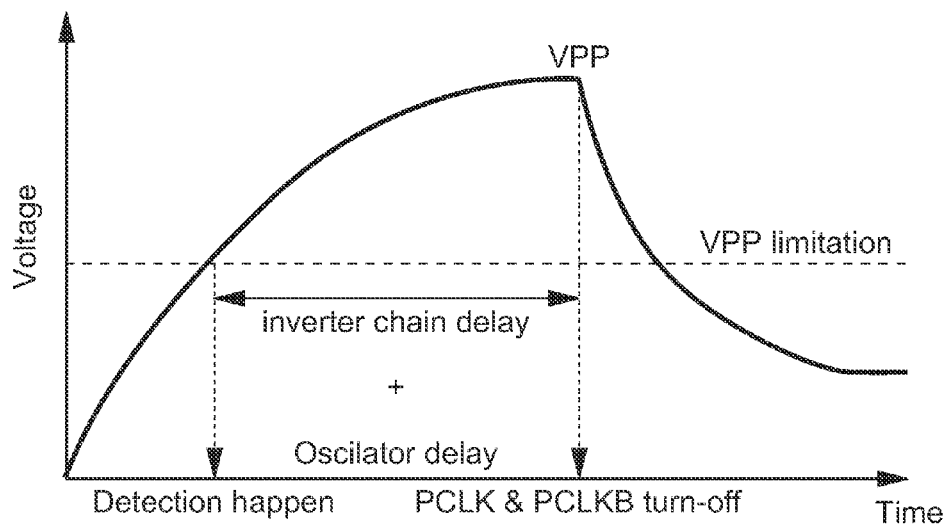
FIG. 16 illustrates adjustable clock regulation ripple.
Figure 17:
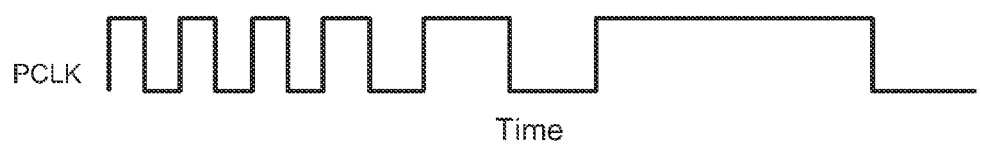
FIG. 17 shows a pump clock regulated by an adjustable clock strategy.

Looking at the adjustable clock frequency arrangement of FIG. 12 further, the pump feed-in clock signals PCLK and PCLKB are still digital signals whose value is either VSS or VDD. As the PCLK and PCLKB typically are directly coupled to the pump charging capacitor, the VDD signal level will again make it difficult to reduce the pump output ripple. When the circuit detects that the pump output voltage is too high/too low, it will always take some time for the pump clock frequency to be changed, as the delay includes the oscillator induced delay and the clock buffer delay (see FIG. 16). This increases the difficulty for the adjustable clock frequency regulation strategy to reduce the pump output ripple. The pump clock generated with the adjustable clock frequency regulation strategy is a variable frequency clock signal (see FIG. 17), which will be unfavorable in the applications which require the period signals frequency must be the integer multiplier of system clock frequency.

Figure 18A:
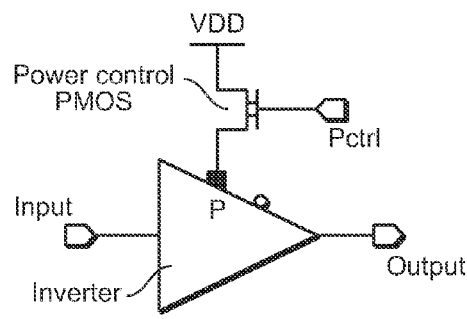
FIGS. 18A-C are examples of level controller inverters.

To help with these problems, the exemplary embodiments of this section present techniques to help improve charge pump power assumption and reduce output voltage ripple. More specifically, the exemplary embodiment uses a level-controlled inverter to build the clock buffer. The power-pin P of the buffers' inverters are connected to VDD through a clamp element, such as an PMOS (FIG. 18A), an NMOS device (FIG. 18B), or a combination NMOS/PMOS circuit (FIG. 18C). Depending on the pump output level, the feedback signal Pctrl (or the combination Pctrl_n and Pctrl_p in FIG. 18C) will clamp the voltage level on power-pin P, and therefore regulate the clock buffer output voltage level as illustrated in FIG. 19: if the pump output is too high, lower level clock signal will be used to reduce pump output level; if the pump output is too low, higher level clock signal will be used to increase the pump output level.

Figure 20:
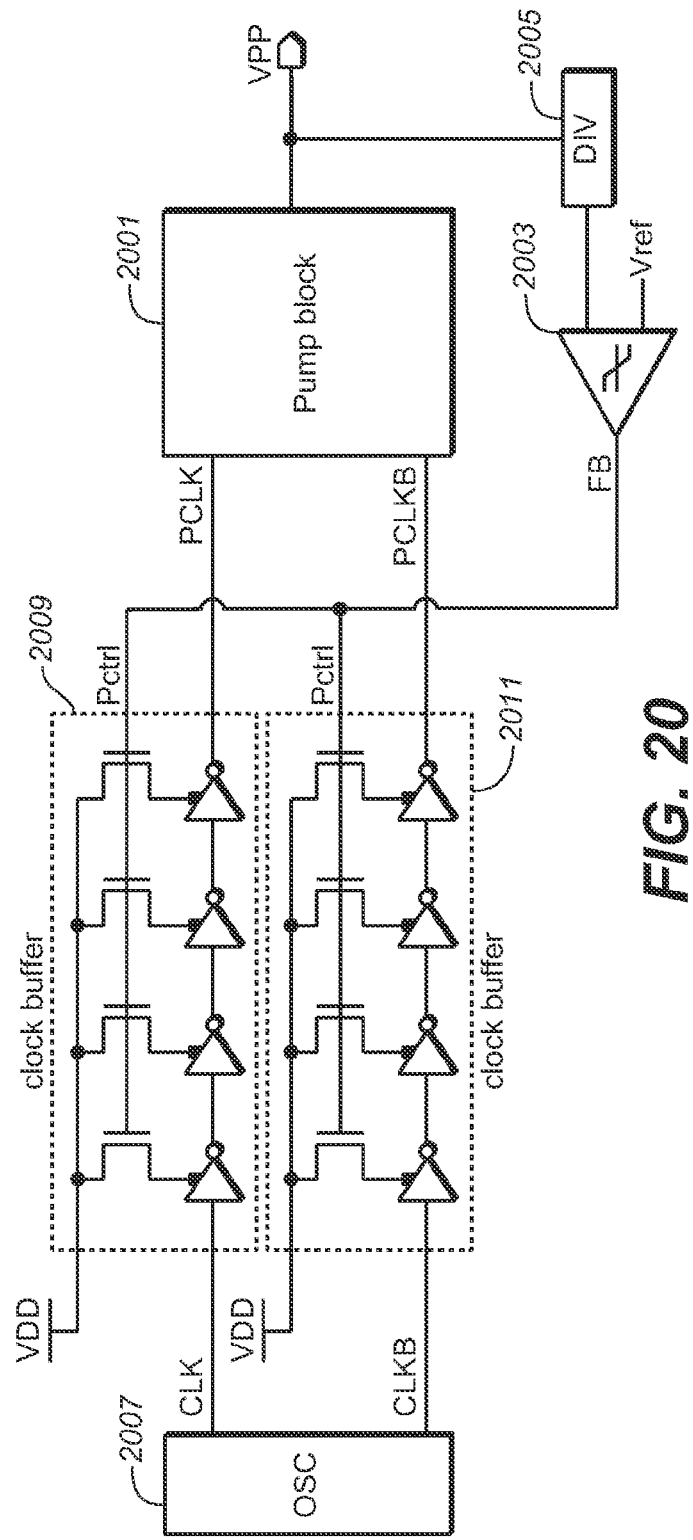
FIG. 20 illustrates an exemplary embodiment of a charge pump system.

FIG. 20 shows an exemplary embodiment for a pump system, here using NMOS devices as the clam elements. The pump block 2001 can again be any of the various pump designs, such as those discussed in the references cited above. In this example, the pump receives a pair of non-overlapping clock signal PCLK and PCLKB and generates from them the output voltage VPP that can be used to drive a load. A feedback signal FB is generated by an op-amp or comparator 2003 based upon the inputs of a reference voltage Vref and level based on the output VPP. Here a voltage divider DIV 2005 is used, where this can be a resistance, capacitive, or hybrid type of regulation, depending on the application (again see the cited references above). An oscillator OSC 2007 provides the initial pair of non-overlapping signals CLK and CLKB that are then supplied respectively to the clock buffers 2009 and 2011 to provide PCLK and PCLKB. The oscillator OSC 2007 can be, for example, a relaxation RC oscillator, ring oscillators or other suitable oscillator circuit. The buffers are made of a number (here four) of inverters feed through clamp circuits as in FIG. 18A, 18B (in this example), 18C, or some combination of these. The inverters themselves could be of any design sufficient to drive the required load, such as a PMOS and NMOS (properly sized) in series between the supply level (here via the clamping element) and ground, with the input connected to the transistors gates and the output taken from a node between the transistors. In this arrangement all of the inverts in the buffer are connected to VDD through a clamp element, but, more generally, this can be done for only a subset of them. If less than all of the inverters use the clamp element, it is preferable that those that do are nearer the end of the change to help to minimize time lag in the regulation process.

Figure 21:
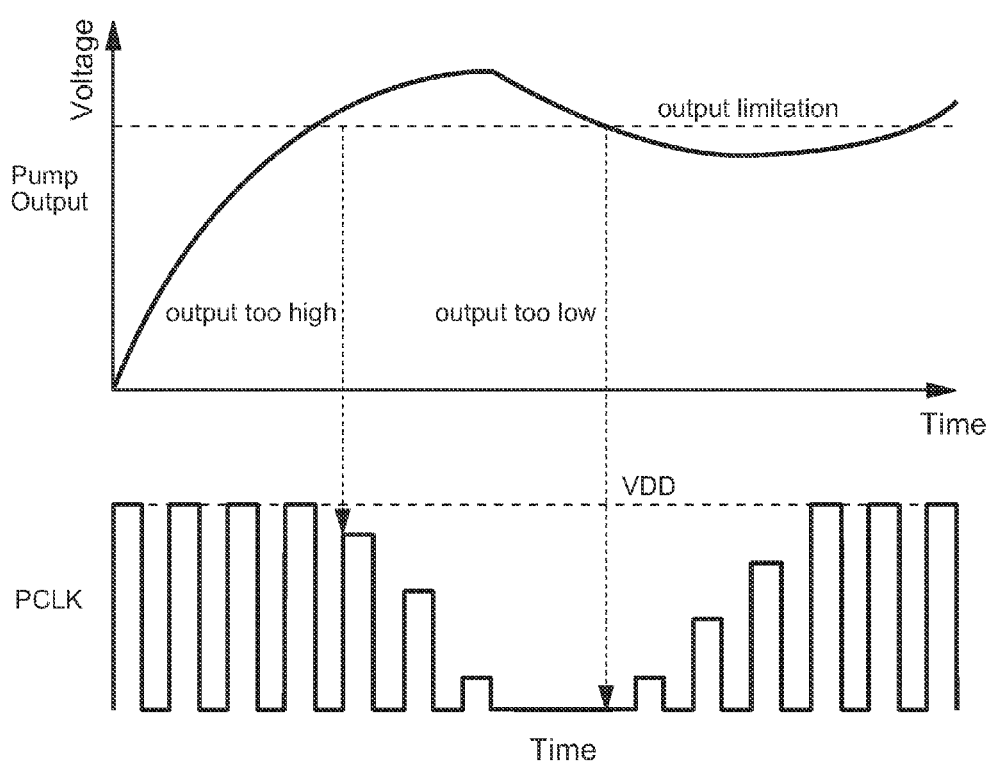
FIG. 21 shows the relation between pump output and pump clock amplitude for the embodiment of FIG. 20.

In the arrangement of FIG. 20 the charge pump uses the level-controlled inverters to build the clock buffer, the voltage detect circuits monitors the pump output VPP and generate the feedback signal FB. FB is connected to the Pctrl pin directly and will regulate the power level supplied to clock buffer. Whenever the VPP level is too high, the FB signal will reduce the clock buffer's power level so the PCLK/PCLKB voltage level will go down and VPP will decrease; whenever the VPP is too low the FB will increase the clock buffer power level so PCLK/PCLKB voltage level will go up and VPP will increase. In this way, VPP will always be clamped to a specified value. FIG. 21 schematically illustrates this.

It should be noted that the approach of varying the clock amplitudes, as illustrated with respect to FIG. 20, is complimentary to the frequency variation approaches illustrated with respect to FIGS. 11 and 12 and, consequently, a hybrid approach combining these techniques can also be used.

Figure 18B:
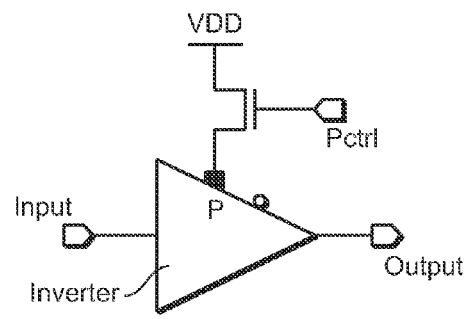
Figure 18C:
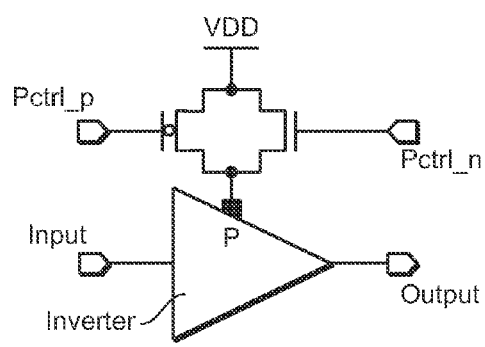
Figure 19:
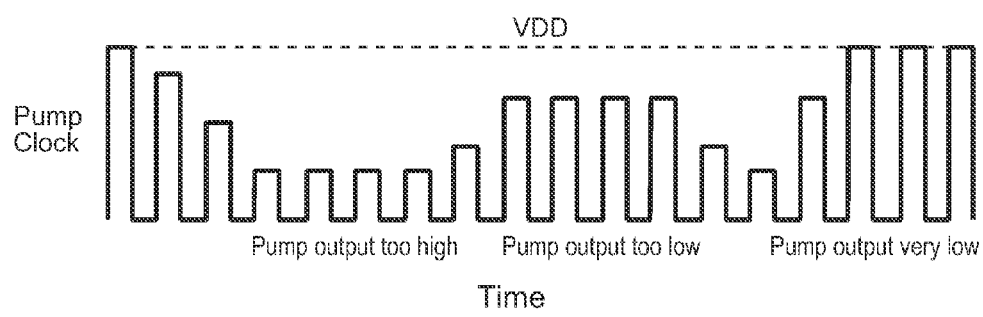
FIG. 19 illustrate regulating of the clock buffer output voltage.

The exemplary embodiment of FIG. 20 used the NMOS based clamping element of FIG. 18B. Due to the NMOS device's threshold voltage Vth, here is voltage drop from the external VDD to internal clock buffer power supply. To suppress the voltage drop, the NMOS gate voltage must be higher than VDD (for example, 5V). Two approaches can be used to generate the Vth offset. In a first approach, the pump's output of VPP output can be regulated to generate the needed 5V power supply for the regulation circuitry to have a sufficient Pctrl level and the gates of the NMOSs. In another approach, a dedicated auxiliary charge pump can be used generate the 5V power supply. Since the control signal is only used to drive the NMOS gates in the clock buffer circuits, both approaches will not consume too much power.

Figure 22:
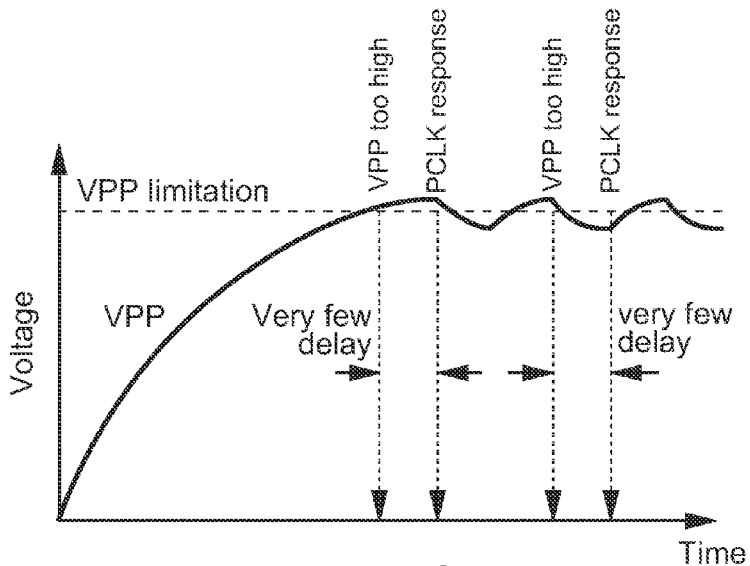
FIG. 22 shows output ripple for the embodiment of FIG. 20.

For any of the variations, the exemplary embodiment has a number of advantages. One of these is that the feed-back control signal FB is directly used to control the Pctrl pin of some or all the inverters in the clock buffers, removing or eliminating any inverter chain related or oscillator related delay: Once the detector has found the pump output is too high or too low, the FB signal will change the Pctrl voltage value to the clock buffer immediately and the clock buffer power consumption and the pump feed-in clock voltage level will be changed simultaneously. Since the pump feed-in clock will be directly coupled to the pump internal charging capacitor, the clock voltage level change will affect the pump output voltage level directly. This can greatly improve the pump output ripple problem, as is illustrate in FIG. 22.

Additionally, since the feed-back control signal FB can control the power supplied to the clock buffer directly, whenever the detector find the pump's output level is too high the FB signal can reduce or even completely turn off the clock buffer power supply immediately, so no unnecessary power will be consumed during this occurrence like what happened in gated clock regulation strategy, improving the pump's power efficiency.

Figure 23:
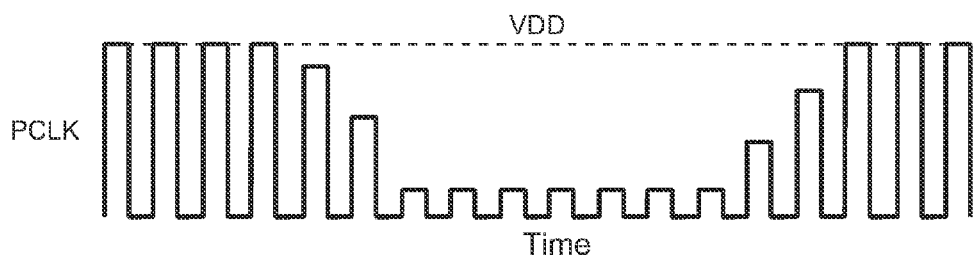
FIG. 23 looks at voltage level variation for a frequency fixed pump feed-in clock signal, such would be suitable for RF applications.
Figure 24:
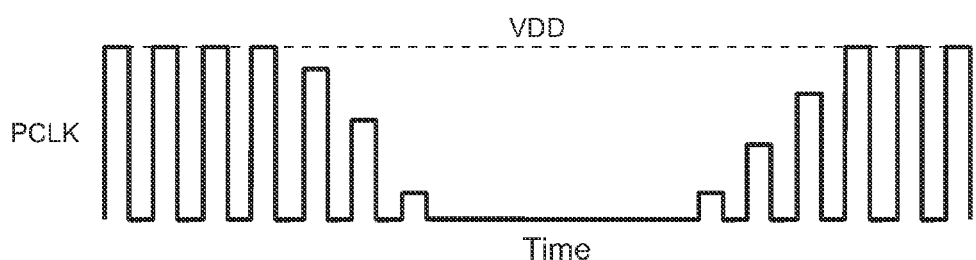
FIG. 24 looks at voltage level variation for a frequency fixed pump feed-in clock signal, such would be suitable for low power applications.

Further, by adjusting the clamp's power-control Pctrl voltage level, these can set the minimum voltage level for the output of the PC_INV circuits to be a specified value so that the circuit can generate a voltage level variant, frequency-fixed pump feed-in clock signal. As shown in FIG. 23, the frequency can be the integer multiplier of system clock. This clock signal will be very favorable in the applications, such as RF applications, that require the period signals frequency must be the integer multiplier of system clock frequency. If the minimum voltage level for the output of the PC_INV circuits is set to be VSS, showed as illustrated in FIG. 23, the circuit can generate a voltage level variant, frequency-variant pump feed-in clock signal, which can be very favorable in the low power applications.

CONCLUSION

Consequently, as described in the preceding section, the described circuits can improve the pump output voltage ripple significantly by using the level-controlled clock signal, making it suitable for applications where the loading current changes often while still being sensitive to pump output changes. The described structures also make it possible to reduce the decoupling capacitor that is typically connected to the pump's output to make the output level smoother. By reducing the decoupling capacitor, the arrangement can save layout area and also increase the pump's start speed. The described arrangement also helps to suppress the noise, peak current and other undesirable features by suppressing the output voltage ripple.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

It is claimed:

1. A charge pump system, comprising:
    a charge pump circuit connected to receive N pump clock signals and generate therefrom an output voltage, where N is an integer greater than or equal to one;
    regulation circuitry connected to receive the output voltage and generate a regulation signal based on the output voltage;
    an oscillator circuit providing N initial clock signals; and
    N clock buffer circuits, each receiving a corresponding one of the initial clock signals and generating therefrom a corresponding one of the pump clock signals, wherein each of the buffer circuits includes:
    a plurality of inverters connected in series, with the first inverter in the series connected to receive the corresponding initial clock signal as input and the last inverter in the series providing the corresponding pump clock signal as output; and
    a corresponding plurality of clamp elements connected to receive the regulation signal and through which a corresponding one of the inverter is connected to a power supply level, the voltage level being supplied to the corresponding inverter being dependent upon the regulation signal.

2. The charge pump system of claim 1, wherein the charge pump circuit is a Dickson type charge pump.

3. The charge pump system of claim 1, wherein the charge pump circuits is a voltage doubler type charge pump.

4. The charge pump system of claim 1, wherein the charge pump circuits is a four-phase type of charge pump.

5. The charge pump circuit of claim 1, wherein N is two and the pump clock signals are non-overlapping.

6. The charge pump circuit of claim 1, wherein the regulation circuitry includes:
    a voltage divider connected between the output voltage and ground; and
    a comparator having a first input connected to a node of the voltage divider, a second input connected to a reference voltage level, and an output supplying the regulation signal.

7. The charge pump circuit of claim 1, wherein each of the inverter comprises:
    a PMOS transistor between an internal node and, through the corresponding clamp element, the power supply level; and
    an NMOS transistor connected between the internal node and ground,
    wherein the input of the inverter is connected to the gates of the PMOS and NMOS transistors and the output of the inverter is taken from the internal node.

8. The charge pump system of claim 1, wherein the clamp element is a PMOS transistor having a gate voltage determined by the regulation signal.

9. The charge pump system of claim 1, wherein the clamp element is an NMOS transistor having a gate voltage determined by the regulation signal.

10. The charge pump system of claim 9, wherein the regulation circuitry includes an auxiliary charge pump for use in generating the regulation signal.

11. The charge pump system of claim 1, wherein the clamp element is a PMOS transistor having a gate voltage determined by the regulation signal in parallel with an NMOS transistor having a gate voltage determined by the regulation signal.

12. The charge pump system of claim 1, wherein the charge pump system is a peripheral circuit element on a monolithic three-dimensional semiconductor memory device.

13. The charge pump system of claim 12, wherein the semiconductor memory device further comprises a three-dimensional (3D) non-volatile memory that includes multiple memory cells arranged in multiple physical levels above a silicon substrate.

14. The charge pump system of claim 13, wherein the charge pump system is connectable to the three-dimensional (3D) non-volatile memory to supply a programming voltage level thereto.

15. The charge pump system of claim 13, wherein the charge pump system is connectable to the three-dimensional (3D) non-volatile memory to supply an erase voltage level thereto.

* * * * *